United States Patent
Jung et al.

(10) Patent No.: US 8,749,415 B2
(45) Date of Patent: Jun. 10, 2014

(54) ANALOG-TO-DIGITAL CONVERTER AND IMAGE SENSOR INCLUDING THE SAME

(75) Inventors: Wun-Ki Jung, Suwon-si (KR); Jin-Ho Seo, Seoul (KR); Kwi-Sung Yoo, Seoul (KR); Min-Ho Kwon, Seoul (KR); Jae-Hong Kim, Daegu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 300 days.

(21) Appl. No.: 13/243,246

(22) Filed: Sep. 23, 2011

(65) Prior Publication Data

US 2012/0097839 A1    Apr. 26, 2012

(30) Foreign Application Priority Data

Oct. 22, 2010    (KR) .................. 10-2010-0103212

(51) Int. Cl.
*H03M 3/00*    (2006.01)
(52) U.S. Cl.
USPC .......................................... 341/143; 341/155
(58) Field of Classification Search
USPC .......... 341/143, 155, 156, 172; 348/294, 295, 348/296
See application file for complete search history.

(56) References Cited

U.S. PATENT DOCUMENTS

| | | | |
|---|---|---|---|
| 7,084,797 B2 * | 8/2006 | Yokoyama et al. | 341/143 |
| 7,565,033 B2 | 7/2009 | Hanson et al. | |
| 7,570,293 B2 | 8/2009 | Nakamura | |
| 7,746,400 B2 * | 6/2010 | Mo | 348/308 |
| 2008/0150776 A1 * | 6/2008 | DiGiandomenico et al. | 341/143 |

FOREIGN PATENT DOCUMENTS

JP    2000-349635 A    12/2000

* cited by examiner

*Primary Examiner* — Joseph Lauture
(74) *Attorney, Agent, or Firm* — Lee & Morse, P.C.

(57) ABSTRACT

An analog-to-digital converter includes a modulation unit and a digital signal generation unit. The modulation unit is disposed corresponding to at least one column line, and sequentially perform delta-sigma modulation on an analog input signal and at least one residue voltage to generate digital bit stream signals. The analog input signal is input through the at least one column line. The at least one residue voltage is generated by performing the delta-sigma modulation on the analog input signal. The digital signal generation unit generates a digital signal corresponding to the analog input signal based on the digital bit stream signals.

15 Claims, 15 Drawing Sheets

ANALOG-TO-DIGITAL CONVERTER AND IMAGE SENSOR INCLUDING THE SAME

CROSS-REFERENCE TO RELATED APPLICATION

Korean Patent Application No. 10-2010-0103212, filed on Oct. 22, 2010, in the Korean Intellectual Property Office, and entitled: "Analog-to-Digital Converter and Image Sensor Including the Same," is incorporated by reference herein in its entirety.

BACKGROUND

1. Technical Field

Example embodiments relate to a signal converter, and more particularly to an analog-to-digital converter and an image sensor including the analog-to-digital converter.

2. Description of the Related Art

To capture images, image sensors of a charge coupled device (CCD) type or a complementary metal oxide semiconductor (CMOS) type are widely used. Typically, an image sensor includes an analog-to-digital converter that converts an analog signal (e.g., a pixel output voltage) output from a unit pixel into a digital signal. The image sensor may include a plurality of analog-to-digital converters that are disposed corresponding to each column of a pixel array where unit pixels are arranged in a matrix form.

SUMMARY

One or more embodiments provide an analog-to-digital converter having enhanced operation speed, small size, and low power consumption.

One or more embodiments provide an image sensor including an analog-to-digital converter having enhanced operation speed, small size, and low power consumption.

One or more embodiments provide an analog-to-digital converter includes a modulation unit and a digital signal generation unit. The modulation unit is disposed corresponding to at least one column line, and sequentially performs delta-sigma modulation on an analog input signal and at least one residue voltage to generate digital bit stream signals. The analog input signal is input through the at least one column line. The at least one residue voltage is generated by performing the delta-sigma modulation on the analog input signal. The digital signal generation unit generates a digital signal corresponding to the analog input signal based on the digital bit stream signals.

The modulation unit may include a first modulator and a second modulator. The first modulator may be disposed corresponding to a first column line, and may perform delta-sigma modulation on a first input signal of the analog input signal to generate a first residue voltage and a first digital bit stream signal. The first input signal may be input through the first column line. The second modulator may be disposed corresponding to a second column line, and may perform delta-sigma modulation on the first residue voltage to generate a second digital bit stream signal.

The first column line and the second column line may be adjacent to each other. The first modulator may further perform delta-sigma modulation on a second input signal of the analog input signal to generate a second residue voltage and a third digital bit stream signal. The second modulator may further perform delta-sigma modulation on the second residue voltage to generate a fourth digital bit stream signal. The second input signal may be input through the second column line.

The first digital bit stream signal may correspond to upper bits of a first digital signal of the digital signal, and the second digital bit stream signal may correspond to lower bits of the first digital signal. The third digital bit stream signal may correspond to upper bits of a second digital signal of the digital signal, and the fourth digital bit stream signal may correspond to lower bits of the second digital signal. The first digital signal may be generated based on the first input signal, and the second digital signal may be generated based on the second input signal.

The third digital bit stream signal and the fourth digital bit stream signal may be generated after the first digital bit stream signal and the second digital bit stream signal are generated.

The analog-to-digital converter may further include a sample-and-hold unit that samples and holds the first residue voltage and the second residue voltage.

The sample-and-hold unit may provide the first residue voltage to the second modulator while the second modulator performs delta-sigma modulation on the first residue voltage. The first modulator may perform delta-sigma modulation on the second input signal to generate the second residue voltage and the third digital bit stream signal while the second modulator performs delta-sigma modulation on the first residue voltage.

The first modulator may hold the first residue voltage to provide the first residue voltage to the second modulator while the second modulator performs delta-sigma modulation on the first residue voltage.

The second modulator may further generate a second residue voltage by performing delta-sigma modulation on the first residue voltage. The first modulator may further perform delta-sigma modulation on the second residue voltage to generate a third digital bit stream signal.

The modulation unit may include a first modulator, a second modulator and a third modulator. The first modulator may be disposed corresponding to a first column line, and may perform delta-sigma modulation on a first input signal of the analog input signal to generate a first residue voltage and a first digital bit stream signal. The first input signal may be input through the first column line. The second modulator may be disposed corresponding to a second column line, and may perform delta-sigma modulation on the first residue voltage to generate a second residue voltage and a second digital bit stream signal. The third modulator may be disposed corresponding to a third column line, and may perform delta-sigma modulation on the second residue voltage to generate a third digital bit stream signal.

The first modulator may hold the first residue voltage to provide the first residue voltage to the second modulator while the second modulator performs delta-sigma modulation on the first residue voltage. The second modulator may hold the second residue voltage to provide the second residue voltage to the third modulator while the third modulator performs delta-sigma modulation on the second residue voltage.

The first modulator may perform delta-sigma modulation on a second input signal of the analog input signal to generate a third residue voltage and a fourth digital bit stream signal while the third modulator performs delta-sigma modulation on the second residue voltage. The second input signal may be input through the second column line.

The modulation unit may include a first modulator and a second modulator. The first modulator may be disposed corresponding to a first column line, and may perform delta-sigma modulation on a first input signal of the analog input signal to generate a first residue voltage and a first digital bit stream signal. The first input signal may be input through the first column line. The second modulator may be disposed corresponding to the first column line, and may perform delta-sigma modulation on the first residue voltage to generate a second digital bit stream signal.

The modulation unit may include a modulator and a sample-and-hold unit. The modulator may be disposed corresponding to a first column line. The modulator may perform delta-sigma modulation on a first input signal of the analog input signal to generate a first residue voltage and a first digital bit stream signal, and may perform delta-sigma modulation on the first residue voltage to generate a second digital bit stream signal. The first input signal may be input through the first column line. The sample-and-hold unit may sample and hold the first residue voltage.

One or more embodiments provide an image sensor includes a pixel array and an analog-to-digital conversion circuit. The pixel array includes a plurality of unit pixels. Each unit pixel converts an incident light into an analog pixel signal. The analog-to-digital conversion circuit includes at least one analog-to-digital converter converting the analog pixel signal into a digital signal. The analog-to-digital converter includes a modulation unit and a digital signal generation unit. The modulation unit is disposed corresponding to at least one column line of the pixel array, and sequentially performs delta-sigma modulation on the analog pixel signal and at least one residue voltage to generate digital bit stream signals. The analog pixel signal is output from the pixel array through the at least one column line. The at least one residue voltage is generated by performing delta-sigma modulation on the analog pixel signal. The digital signal generation unit generates the digital signal based on the digital bit stream signals.

Accordingly, in an analog-to-digital converter according to example embodiments, the modulation unit is disposed corresponding to at least one column line, and has a multistage structure. The modulation unit sequentially performs delta-sigma modulation on an analog input signal and at least one residue voltage by using the multistage structure to generate digital bit stream signals each of which corresponds to some bits of a digital signal. Thus, the analog-to-digital converter may have relatively small size, low power consumption, and enhanced operation speed.

One or more embodiments provide an analog-to-digital converter, including a multi-stage modulation unit including a first modulator and a second modulator configured to perform delta-sigma modulation, wherein the first modulator is configured to perform delta-sigma modulation on an analog input signal, and the second modulator is configured to perform delta-sigma modulation on an output signal of the first modulator.

Each of the first modulator and the second modulator may respectively correspond to at least one of a plurality of column lines of a pixel array.

Each of the first modulator and the second modulator may be configured to generate a respective bit stream signal based on the analog input signal input into the multi-stage modulation unit.

The analog-to-digital converter may include a digital signal generator configured to generate a digital signal corresponding to the analog input signal based on the digital bit stream signals from the first modulator and the second modulator.

The bit stream signals respectively output from the first modulator and the second modulator may correspond to respective bits of the digital signal output by the digital signal generator.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION OF THE EMBODIMENTS

Figure 1:
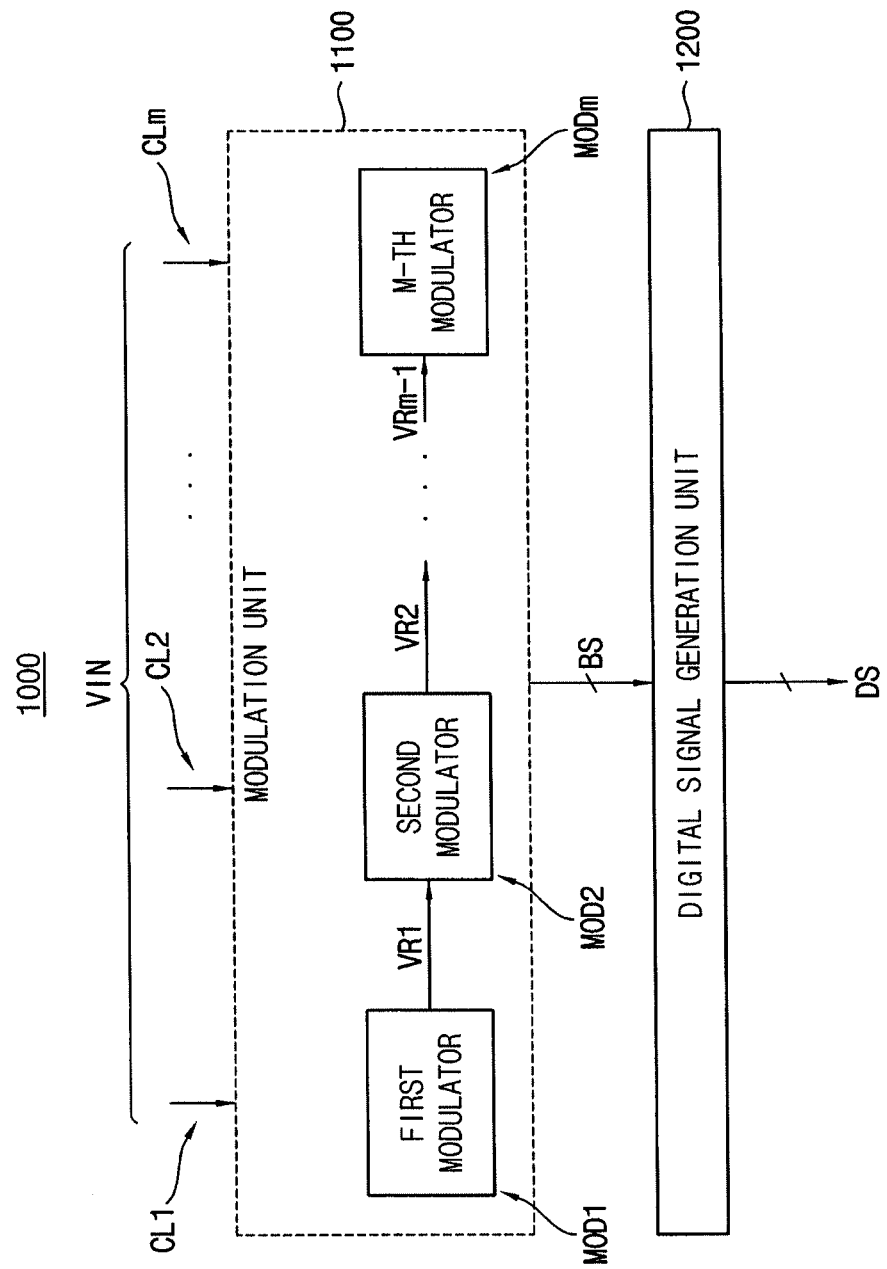
FIG. 1 illustrates a block diagram of an exemplary embodiment of an analog-to-digital converter.

Various example embodiments will be described more fully with reference to the accompanying drawings, in which embodiments are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a block diagram of an exemplary embodiment of an analog-to-digital converter.

Referring to FIG. 1, the analog-to-digital converter 1000 may include a modulation unit 1100, and a digital signal generation unit 1200.

The modulation unit 1100 may be disposed corresponding to one, some, or all of a plurality of column lines. That is, the modulation unit 1100 may be disposed to receive an analog input signal VIN through at least one column line, and to perform delta-sigma modulation on the analog input signal VIN. In some embodiments, the modulation unit 1100 may be disposed corresponding to first through m-th column lines CL1, CL2, ..., CLm, where m is a natural number equal to or greater than two. In some embodiments, the modulation unit 1100 may be disposed corresponding to a single column line CL1, as illustrated, e.g., in FIGS. 12, 14 and 16. More particularly, as described below with reference to FIGS. 19 and 20, the analog-to-digital converter 1000 may be employed in an image sensor that includes a pixel array in which unit pixels are arranged in a matrix form. Each column line may be connected to a column of the pixel array, and may provide an analog pixel signal generated from each unit pixel in the column to the modulation unit 1100. In one or more embodiments of the image sensor including the analog-to-digital converters 1000, the number of the analog-to-digital converters 1000 included may be obtained by dividing the number of column lines coupled to the pixel array by m (where m is a number of modulators of the modulation unit 1100).

The modulation unit 1100 may sequentially perform delta-sigma modulation on the analog input signal VIN and at least one residue voltage VR1, VR2, ..., VRm−1 to generate digital bit stream signals BS. The analog input signal VIN is input through the first through m-th column lines CL1, CL2, ..., CLm. The at least one residue voltage VR1, VR2, ..., VRm−1 may be generated by performing delta-sigma modulation on the analog input signal VIN.

The modulation unit 1100 may include a plurality of modulators. To perform sequential operation, the modulation unit 1100 may have a plurality of stages (i.e., a multistage structure). For example, the modulation unit 1100 may include first through m-th modulators MOD1, MOD2, ..., MODm that are cascade-coupled from a first modulator MOD1 to a m-th modulator MODm. Each modulator may correspond to one of the plurality of stages of the modulation unit 1100, and may be disposed corresponding to a respective one of the column lines CL1, CL2, ..., CLm. For example, a first modulator MOD1 may correspond to a first stage of the modulation unit 1100 and may be disposed corresponding to a first column line CL1. An m-th modulator MODm may correspond to a m-th stage of the modulation unit 1100 and may be disposed corresponding to a m-th column line CLm.

In one or more embodiments, each of modulators MOD1, MOD2, ..., MODm may perform delta-sigma modulation based on an output signal of a previous-stage modulator, may output a result of the operation of delta-sigma modulation to a next-stage modulator, and may generate at least one digital bit stream signal. For example, the first modulator MOD1 may perform delta-sigma modulation on the analog input signal VIN to generate a first residue signal VR1 and a first digital bit stream signal of the digital bit stream signals BS. The second modulator MOD2 may perform delta-sigma modulation on the first residue signal VR1 to generate a second residue signal VR2 and a second digital bit stream signal of the digital bit stream signals BS. The m-th modulator MODm may perform delta-sigma modulation on a (m−1)-th residue signal VRm−1 to generate a m-th digital bit stream signal of the digital bit stream signals BS. Each digital bit stream signal may correspond to some bits of a digital signal DS. The digital signal DS may have n bits, where n is a natural number equal to or greater than two.

In one or more embodiments, each of modulators MOD1, MOD2, ..., MODm may be a first-order incremental delta-sigma modulator. As described below with reference to FIG. 3, if the modulation unit 1100 is implemented with the multistage structure by using the first-order incremental delta-sigma modulators, each of modulators MOD1, MOD2, ..., MODm may effectively perform delta-sigma modulation on the residue voltage generated from the previous-stage modulator, without any additional calculations or additional operations.

The analog input signal VIN may include first through m-th input signals (e.g., analog pixel signals) each of which is input through a respective one of the column lines CL1, CL2, ..., CLm. For example, a first input signal may be input through a first column line CL1, and a m-th input signal may be input through a m-th column line CLm. The modulation unit 1100 may sequentially perform delta-sigma modulation on the first through m-th input signals.

The digital signal generation unit 1200 may generate the digital signal DS corresponding to the analog input signal VIN based on the digital bit stream signals BS. For example, the digital signal generation unit 1200 may count values of the digital bit stream signals BS to generate count results, may multiply each of the count results by a respective weight value to generate weighted count results, and may add the weighted count results to each other to generate the digital signal DS. If the analog input signal VIN includes the first through m-th input signals, the digital signal DS may include first through m-th digital signals. The digital signal generation unit 1200 may sequentially generate the first through m-th digital signals.

In one or more embodiments, the first digital bit stream signal of the digital bit stream signals BS may be multiplied by a first weight value and the second digital bit stream signal of the digital bit stream signals BS may be multiplied by a second weight value. The first weight value may be larger than the second weight value if the first digital bit stream signal corresponds to upper bits of the digital signal DS than the second digital bit stream signal.

In a conventional analog-to-digital converter including first-order incremental delta-sigma modulators, an operation speed exponentially decreases as a number of bits increases because the conventional analog-to-digital converter may require a predetermined time corresponding to 2n times larger than a period of a clock signal to convert an analog signal into a digital signal having n bits. To improve the operation speed, an analog-to-digital converter including high-order incremental delta-sigma modulators is proposed, but the analog-to-digital converter including the high-order incremental delta-sigma modulators has relatively complex structure and relatively high power consumption.

In one or more embodiments of the analog-to-digital converter 1000, the modulation unit 1100 may be disposed corresponding to the at least one column line of the plurality of column lines, and may have a multistage structure. The modulation unit 1100 may include at least one modulator. In embodiments in which the modulation unit 1100 includes a plurality of modulators, the modulators may be cascade-coupled from the first modulator to the last modulator, and may sequentially perform delta-sigma modulation on the analog input signal VIN and the at least one residue voltage VR1, VR2, . . . , VRm–1 to generate the digital bit stream signals BS. The digital bit stream signals may correspond to bits of the digital signal DS, respectively. Thus, one or more embodiments of the analog-to-digital converter 1000 may have relatively small size, low power consumption, and enhanced operation speed. The analog-to-digital converter 1000 may be employed in an image sensor having a relatively high frame rate and/or high resolution.

Figure 2:
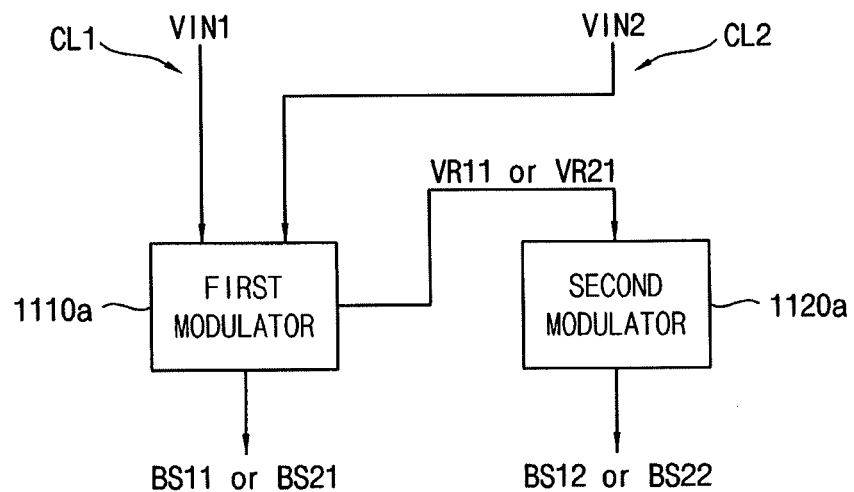
FIG. 2 illustrates a block diagram of an exemplary embodiment of a modulation unit employable in the analog-to-digital converter of FIG. 1.

FIG. 2 illustrates a block diagram of an exemplary embodiment of a modulation unit 1100a employable in the analog-to-digital converter 1000 of FIG. 1.

Referring to FIG. 2, a modulation unit 1100a may include a first modulator 1110a and a second modulator 1120a. The modulation unit 1100a may be disposed corresponding to two column lines CL1 and CL2 that are adjacent to each other, and may have two stages. The first modulator 1110a may correspond to a first stage of the modulation unit 1100a. The second modulator 1120a may correspond to a second stage of the modulation unit 1100a.

The analog-to-digital converter 1000 including the modulation unit 1100a may generate the digital signal having n bits. The first stage of the modulation unit 1100a may generate a digital bit stream signal corresponding to first bits of the digital signal, and the second stage of the modulation unit 1100a may generate a digital bit stream signal corresponding to second bits of the digital signal. The first bits may be upper bits of the digital signal such that the number of the first bits may be x, where x is a natural number equal to or greater than one, and equal to or smaller than n. The second bits may be lower bits of the digital signal such that the number of the second bits may be (n–x).

The first modulator 1110a may be disposed corresponding to a first column line CL1, and may perform delta-sigma modulation on a first input signal VIN1 of the analog input signal VIN to generate a first residue voltage VR11 and a first digital bit stream signal BS11. The first input signal VIN1 may be provided through the first column line CL1. The first digital bit stream signal BS11 may correspond to first bits of a first digital signal that is generated based on the first input signal VIN1. The first residue voltage VR11 may correspond to a quantization error that is generated when the first input signal VIN1 is converted into the first digital bit stream signal BS11.

The second modulator 1120a may be disposed corresponding to a second column line CL2, and may perform delta-sigma modulation on the first residue voltage VR11 to generate a second digital bit stream signal BS12. The second digital bit stream signal BS12 may correspond to second bits of the first digital signal. A quantization error generated by the second modulator 1120a may be neglected since all bits of the first digital signal are generated through the first and second stages.

In one or more embodiments, the first modulator 1110a may further perform delta-sigma modulation on a second input signal VIN2 of the analog input signal VIN to generate a second residue voltage VR21 and a third digital bit stream signal BS21. The second input signal VIN2 may be provided through the second column line CL2. The second modulator 1120a may further perform delta-sigma modulation on the second residue voltage VR21 to generate a fourth digital bit stream signal BS22. The third digital bit stream signal BS21 may correspond to first bits of a second digital signal that is generated based on the second input signal VIN2. The second residue voltage VR21 may correspond to a quantization error that is generated when the second input signal VIN2 is converted into the third digital bit stream signal BS21. The fourth digital bit stream signal BS22 may correspond to second bits of the second digital signal.

The first input signal VIN1 may be generated from a first unit pixel, and the second input signal VIN2 may be generated from a second unit pixel. The first unit pixel may be disposed in a first column of the pixel array in the image sensor, and the second unit pixel may be disposed in a second column of the pixel array.

In one or more embodiments, the modulation unit 1100a may perform delta-sigma modulation on the second input signal VIN2 after delta-sigma modulation on the first input signal VIN1 is completed. For example, the third digital bit stream signal BS21 and the fourth digital bit stream signal BS22 may be generated after the first digital bit stream signal BS11 and the second digital bit stream signal BS12 are generated. In one or more alternative embodiments, the modulation unit 1100a may perform delta-sigma modulation on the first and second input signals VIN1 and VIN2 in a pipeline manner. For example, the first and second digital bit stream signals BS11 and BS12 may be sequentially generated. The third digital bit stream signal BS21 may be generated while the second digital bit stream signal BS12 is generated, and then the fourth digital bit stream signal BS22 may be generated.

Figure 3:
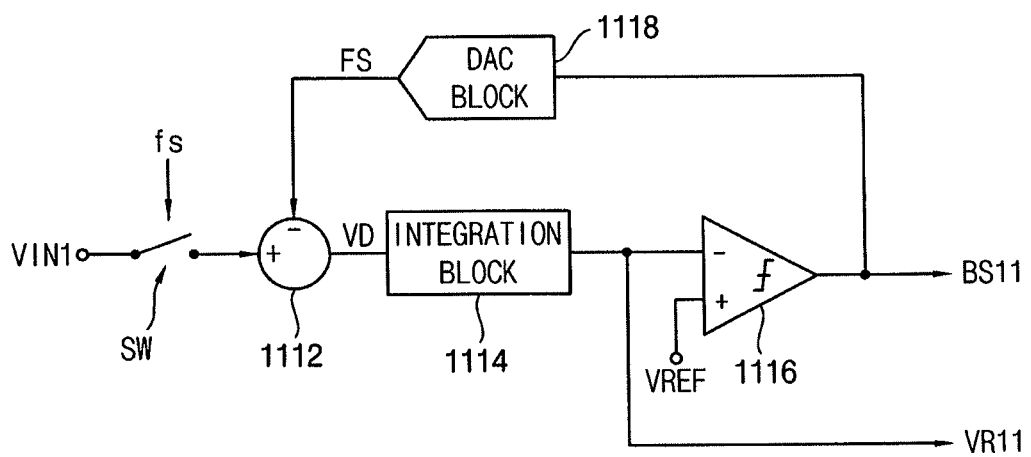
FIG. 3 illustrates a block diagram of an exemplary embodiment of a first modulator of the modulation unit of FIG. 2.

FIG. 3 illustrates a block diagram of an exemplary embodiment of a first modulator of the modulation unit 1100a of FIG. 2.

Referring to FIG. 3, the first modulator 1110a may include a switch SW, a subtraction block 1112, an integration block 1114, a quantization block 1116, and a digital to analog conversion (DAC) block 1118.

The switch SW may sample the first input signal VIN1 in response to a sampling signal fs. The subtraction block 1112 may generate a difference signal VD by subtracting a feedback signal FS from the sampled first input signal VIN1. The integration block 1114 may integrate the difference signal VD to generate the first residue voltage VR11. The quantization block 1116 may quantize the first residue voltage VR11 based on a reference signal VREF to generate the first digital bit stream signal BS11. The quantization block 1116 may be implemented with a comparator and the reference signal VREF may be provided from a reference signal generator (not illustrated). The digital to analog conversion block 1118 may convert the first digital bit stream signal BS11 into the feedback signal FS.

In one or more embodiments, the switch SW, the subtraction block 1112, the integration block 1114, the quantization block 1116, and the digital to analog conversion block 1118 may further perform such sampling, subtracting, integrating, quantization, and converting operations with respect to the second input signal VIN2 to generate the second residue voltage VR21 and the third digital bit stream signal BS21.

Although the first modulator 1110a is illustrated in FIG. 3, some or all of the remaining modulators, e.g., the second modulator 1120a in FIG. 2, may have substantially the same structure as the first modulator 1110a of FIG. 3.

In the first-order incremental delta-sigma modulator, a residue component that remains in the first-order incremental delta-sigma modulator after the delta-sigma modulation corresponds to a quantization error. The residue component is amplified and the amplified residue component is output as the residue voltage because of a characteristic of the first-order incremental delta-sigma modulator. If each of the first and second modulators 1110a and 1120a in FIG. 2 is implemented with the first-order incremental delta-sigma modulator, the second modulator 1120a corresponding to the second stage does not need to amplify the first residue voltage VR11, but directly perform delta-sigma modulation on the first residue voltage VR11. The analog-to-digital converter 1000 of FIG. 1 including the first-order incremental delta-sigma modulator does not need to have an additional circuit for amplifying the residue voltage output from the previous-stage, and thus has the multistage structure with relatively simple structure.

Figure 4:
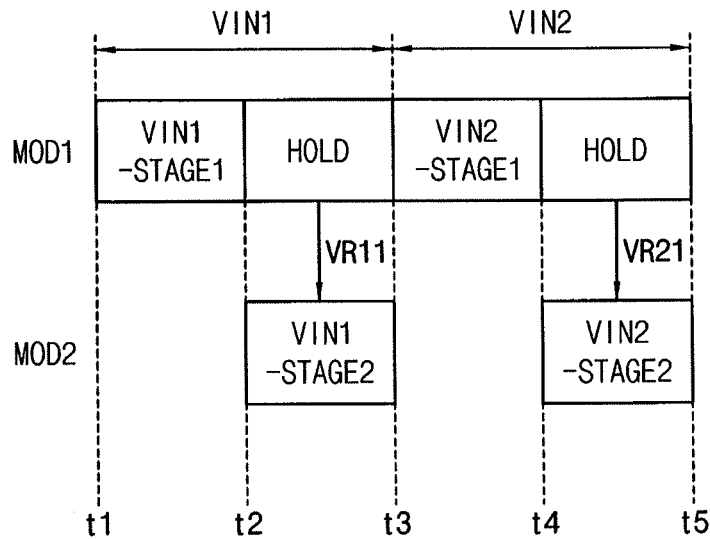
FIG. 4 illustrates a diagram of an exemplary embodiment of an operation of the modulation unit of FIG. 2.

FIG. 4 illustrates a diagram of an exemplary embodiment of an operation of the modulation unit 1100a of FIG. 2.

Hereinafter, exemplary operation of the modulation unit 1100a of FIG. 2 is described with reference to FIGS. 2, 3 and 4. In FIG. 4, a reference numeral MOD1 indicates an operation of the first modulator 1110a, and a reference numeral MOD2 indicates an operation of the second modulator 1120a.

The modulation unit 1100a may perform delta-sigma modulation on the first input signal VIN1 during a first operation period (from time t1 to time t3), and may perform delta-sigma modulation on the second input signal VIN2 during a second operation period (from time t3 to time t5). That is, the modulation unit 1100a may perform delta-sigma modulation on the second input signal VIN2 after delta-sigma modulation on the first input signal VIN1 is completed. The modulation unit 1100a may sequentially generate the first digital bit stream signal BS11 and the second digital bit stream signal BS12 during the first operation period, and may sequentially generate the third digital bit stream signal BS21 and the fourth digital bit stream signal BS22 during the second operation period after the first and second digital bit stream signals BS11 and BS12 are generated.

During a first modulation period (from time t1 to time t2) of the first operation period, the first modulator 1110a may perform delta-sigma modulation on the first input signal VIN1 to generate the first residue voltage VR11 and the first digital bit stream signal BS11. As described above with reference to FIG. 3, delta-sigma modulation may include such sampling, subtracting, integrating and quantization operations.

During a second modulation period (from time t2 to time t3) of the first operation period, the second modulator 1120a may perform delta-sigma modulation on the first residue voltage VR11 to generate the second digital bit stream signal BS12. While the second modulator 1120a performs delta-sigma modulation on the first residue voltage VR11, the first modulator 1110a may hold the first residue voltage VR11 to provide the first residue voltage VR11 to the second modulator 1120a since the delta-sigma modulator needs to consistently receive an input signal during the delta-sigma modulation on the input signal.

During a first modulation period (from time t3 to time t4) of the second operation period, the first modulator 1110a may perform delta-sigma modulation on the second input signal VIN2 to generate the second residue voltage VR21 and the third digital bit stream signal BS21. During a second modulation period (from time t4 to time t5) of the second operation period, the second modulator 1120a may perform delta-sigma modulation on the second residue voltage VR21 to generate the fourth digital bit stream signal BS22. While the second modulator 1120a performs delta-sigma modulation on the second residue voltage VR21, the first modulator 1110a may hold the second residue voltage VR21 to provide the second residue voltage VR21 to the second modulator 1120a.

The digital signal generation unit 1200 in FIG. 1 may generate the first digital signal corresponding to the first input signal VIN1 based on the first and second digital bit stream signals BS11 and BS12, and may generate the second digital signal corresponding to the second input signal VIN2 based on the third and fourth digital bit stream signals BS21 and BS22.

The modulation unit 1100a may repeat such delta-sigma modulation. If the analog-to-digital converter 1000 is employed in an image sensor that includes a pixel array, the modulation unit 1100a may sequentially delta-sigma modulation on each row of the pixel array, that is, by unit of row of unit pixels included in the pixel array. For example, the modulation unit 1100a may perform delta-sigma modulation on analog input signals that are output from a first row of the pixel array and may then perform delta-sigma modulation on analog input signals that are output from a second row of the pixel array.

In the analog-to-digital converter 1000 including the modulation unit 1100a of FIG. 2, the modulation unit 1100a may include the first and second modulators 1110a and 1120a, which may be implemented with two-stage structure. The analog-to-digital converter 1000 may have enhanced operation speed.

More particularly, take, e.g., a case in which the analog-to-digital converter generates a digital signal having twelve bits. In a conventional analog-to-digital converter having a one-stage structure, it is required to spend $2^{12}$ (i.e. 4096) clock periods for converting a single analog input signal into a single digital signal, and such converting operation in the conventional analog-to-digital converter is simultaneously performed with respect to all analog input signals. Thus, the conventional analog-to-digital converter requires 4096 clock periods for converting all analog signals input through all the column lines into digital signals.

In embodiments employing, e.g., the analog-to-digital converter 1000 including the modulation unit 1100a of FIG. 2, if the first modulator 1110a generates the first digital bit stream signal BS11 corresponding to upper six bits of the first digital signal and the second modulator 1120a generates the second digital bit stream signal BS12 corresponding to lower six bits of the first digital signal, it is required to spend $2^6+2^6$ (i.e. 128) clock periods for converting the first analog signal VIN1 into the first digital signal. In the analog-to-digital converter 1000 including the modulation unit 1100a of FIG. 2 such a converting operation may be sequentially performed with respect to the first input signal VIN1 and the second input signal VIN2. Thus, the analog-to-digital converter 1000 including the modulation unit 1100a of FIG. 2 requires 256 clock periods for converting all analog signals input through all the column lines into digital signals.

Figure 5:
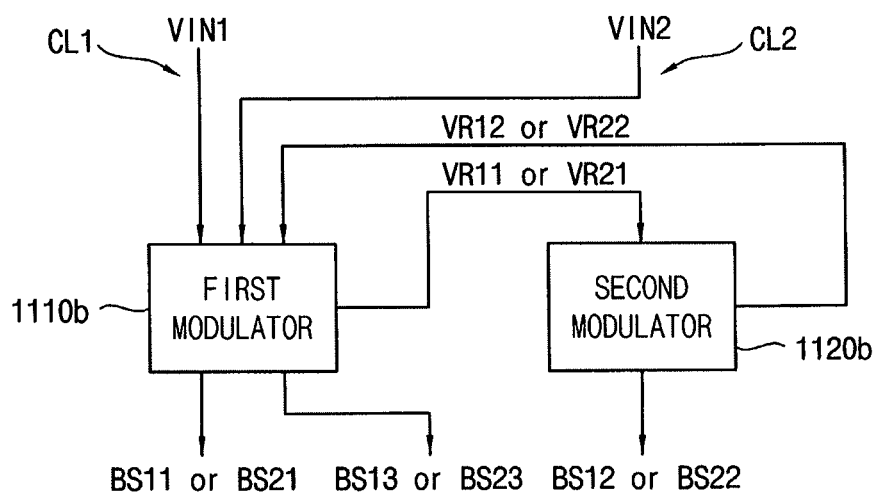
FIG. 5 illustrates a block diagram of another exemplary embodiment of a modulation unit employable in the analog-to-digital converter of FIG. 1.

FIG. 5 illustrates a block diagram of another exemplary embodiment of a modulation unit 1100b employable in the analog-to-digital converter of FIG. 1. In general, only differences between the modulation unit 1100a of FIG. 2 and the modulation unit 1100b of FIG. 5 will be described below.

Referring to FIG. 5, the modulation unit 1100b may include a first modulator 1110b and a second modulator 1120b. The modulation unit 1100b may be disposed corresponding to two column lines CL1 and CL2, and may have three stages. The first modulator 1110b may correspond to a first stage and a third stage of the modulation unit 1100b. The second modulator 1120b may correspond to a second stage of the modulation unit 1100b.

The analog-to-digital converter 1000 including the modulation unit 1100b may generate the digital signal having n bits. The first stage of the modulation unit 1100b may generate a digital bit stream signal corresponding to first bits of the digital signal, the second stage of the modulation unit 1100b may generate a digital bit stream signal corresponding to second bits of the digital signal, and the third stage of the modulation unit 1100b may generate a digital bit stream signal corresponding to third bits of the digital signal. The first bits may be upper bits of the digital signal such that the number of the first bits may be x. The second bits may be middle bits of the digital signal such that the number of the second bits may be y, where y is a natural number equal to or greater than one, and equal to or smaller than (n−x). The third bits may be lower bits of the digital signal such that the number of the third bits may be (n−x−y).

The modulation unit 1100b may operate similarly to the modulation unit 1100a of FIG. 2. The first modulator 1110b may be disposed corresponding to a first column line CL1, and may perform delta-sigma modulation on a first input signal VIN1 to generate a first residue voltage VR11 and a first digital bit stream signal BS11. The second modulator 1120b may be disposed corresponding to a second column line CL2, and may perform delta-sigma modulation on the first residue voltage VR11 to generate a second digital bit stream signal BS12.

In comparison with the modulation unit 1100a of FIG. 2, the second modulator 1120b of the modulation unit 1100b may further generate a second residue voltage VR12 by performing delta-sigma modulation on the first residue voltage VR11. The second residue voltage VR12 may correspond to a quantization error that is generated when the first residue voltage VR11 is converted into the second digital bit stream signal BS12. The first modulator 1110b of the modulation unit 1100b may further perform delta-sigma modulation on the second residue voltage VR12 to generate a third digital bit stream signal BS13.

The first digital bit stream signal BS11 may correspond to first bits (e.g., upper bits) of a first digital signal that is generated based on the first input signal VIN1. The second digital bit stream signal BS12 may correspond to second bits (e.g., middle bits) of the first digital signal. The third digital bit stream signal BS13 may correspond to third bits (e.g., lower bits) of the first digital signal.

Figure 6:
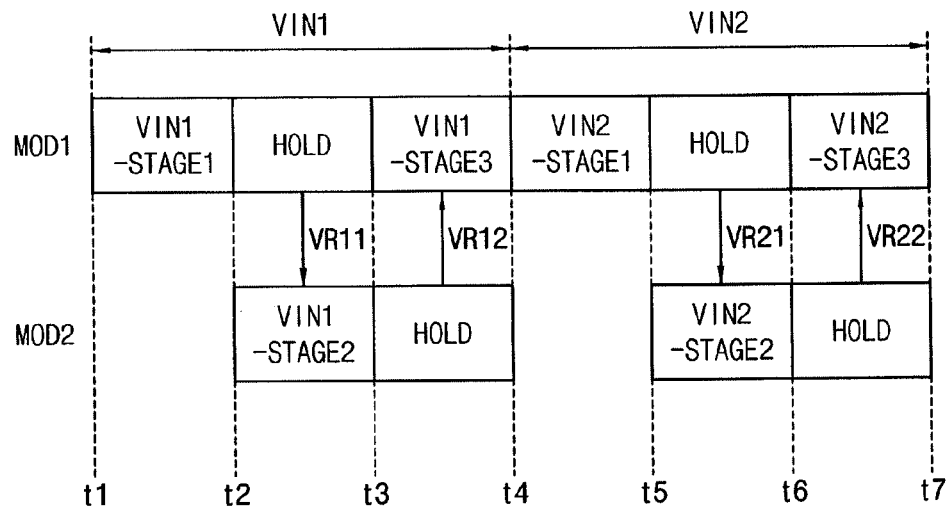
FIG. 6 illustrates a diagram of an exemplary embodiment of an operation of the modulation unit of FIG. 5.

FIG. 6 illustrates a diagram of an exemplary embodiment of an operation of the modulation unit 1100b of FIG. 5.

Hereinafter, exemplary operation of the modulation unit 1100b of FIG. 5 is described with reference to FIGS. 5 and 6. In FIG. 6, a reference numeral MOD1 indicates an operation of the first modulator 1110b, and a reference numeral MOD2 indicates an operation of the second modulator 1120b. In general, only differences between the exemplary operation corresponding to FIGS. 2-4 and the exemplary operation corresponding to FIGS. 5 and 6 will be described below.

The modulation unit 1100b may perform delta-sigma modulation on the first input signal VIN1 input through the first column line CL1 during a first operation period (from time t1 to time t4), and may perform delta-sigma modulation on the second input signal VIN2 input through the second column line CL2 during a second operation period (from time t4 to time t7). That is, the modulation unit 1100b may perform delta-sigma modulation on the second input signal VIN2 after delta-sigma modulation on the first input signal VIN1 is completed.

The operation of the modulation unit 1100b during a time period from time t1 to time t3 in FIG. 6 may be similar to the operation of the modulation unit 1100a during the time period from time t1 to time t3 in FIG. 4. During a first modulation period (from time t1 to time t2) of the first operation period, the first modulator 1110b may generate the first residue voltage VR11 and the first digital bit stream signal BS11 based on the first input signal VIN1.

During a second modulation period (from time t2 to time t3) of the first operation period, the first modulator 1110b may hold the first residue voltage VR11 to provide the first residue voltage VR11 to the second modulator 1120b. The second modulator 1120b may generate the second digital bit stream signal BS12 based on the first residue voltage VR11. In addition, the second modulator 1120b may generate the second residue voltage VR12 by performing delta-sigma modulation on the first residue voltage VR11.

During a third modulation period (from time t3 to time t4) of the first operation period, the first modulator 1110b may perform delta-sigma modulation on the second residue voltage VR12 to generate the third digital bit stream signal BS13. While the first modulator 1110b performs delta-sigma modulation on the second residue voltage VR12, the second modulator 1120b may hold the second residue voltage VR12 to provide the second residue voltage VR12 to the first modulator 1110b.

The operation of the modulation unit 1100b during a time period from time t4 to time t6 in FIG. 6 may be similar to the operation of the modulation unit 1100a during the time period from time t3 to time t5 in FIG. 4. During a first modulation period (from time t4 to time t5) of the second operation period, the first modulator 1110b may generate a third residue voltage VR21 and a fourth digital bit stream signal BS21 based on the second input signal VIN2. During a second modulation period (from time t5 to time t6) of the second operation period, the second modulator 1120b may generate the fifth digital bit stream signal BS22 based on the third delta-sigma modulation on the third residue voltage VR21. During a third modulation period (from time t6 to time t7) of the second operation period, the first modulator 1110b may perform delta-sigma modulation on the fourth residue voltage VR22 to generate the sixth digital bit stream signal BS23. The first modulator 1110b may hold the third residue voltage VR21 to provide the third residue voltage VR21 to the second modulator 1120b during the second modulation period of the second operation period, and the second modulator 1120b may hold the fourth residue voltage VR22 to provide the fourth residue voltage VR22 to the first modulator 1110b during the third modulation period of the second operation period.

In the analog-to-digital converter 1000 including the modulation unit 1100b of FIG. 5, the modulation unit 1100b may include the first and second modulators 1110b, 1120b that are implemented with a multi-stage, e.g., three-stage, structure, and thus the analog-to-digital converter 1000 may have an enhanced operation speed.

Take, e.g., a case in which an analog-to-digital converter generates the digital signal having twelve bits. A conventional analog-to-digital converter having one-stage structure requires 4096 clock periods for converting all analog signals input through the all column lines into digital signals. However, in the analog-to-digital converter 1000 including the modulation unit 1100b of FIG. 5, if the first digital bit stream signal BS11 corresponds to upper four bits of the first digital signal, the second digital bit stream signal BS12 corresponds to middle four bits of the first digital signal, and the third digital bit stream signal BS13 corresponds to lower four bits of the first digital signal, it is required to spend $2^4+2^4+2^4$ (i.e. 48) clock periods for converting the first analog signal VIN1 into the first digital signal. Such a converting operation in the analog-to-digital converter 1000 including the modulation unit 1100b of FIG. 5 may be sequentially performed with respect to the two input signals VIN1 and VIN2. More particularly, e.g., in such embodiments, the analog-to-digital converter 1000 including the modulation unit 1100b of FIG. 5 requires 96 clock periods for converting all analog signals input through the all column lines into digital signals.

Figure 7:
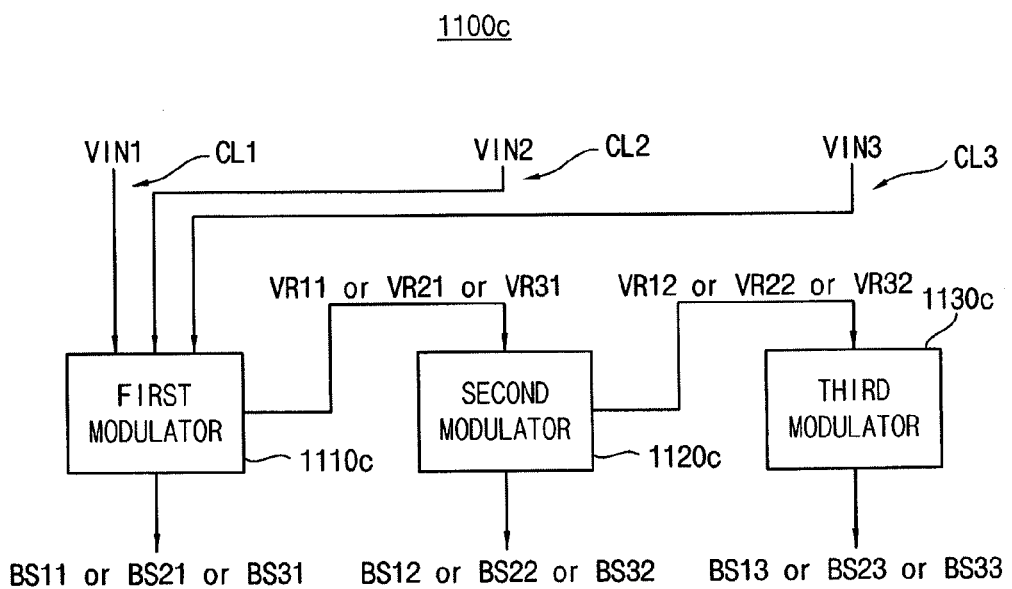
FIG. 7 illustrates a block diagram of another exemplary embodiment of a modulation unit employable in the analog-to-digital converter of FIG. 1.

FIG. 7 illustrates a block diagram of another exemplary embodiment of a modulation unit 1100c employable in the analog-to-digital converter of FIG. 1.

Referring to FIG. 7, the modulation unit 1100c may include a first modulator 1110c, a second modulator 1120c, and a third modulator 1130c. The modulation unit 1100c may be disposed corresponding to three column lines CL1, CL2 and CL3, and may have three stages. The first modulator 1110c may be disposed corresponding to a first column line CL1, and may correspond to a first stage of the modulation unit 1100c. The second modulator 1120c may be disposed corresponding to a second column line CL2, and may correspond to a second stage of the modulation unit 1100c. The third modulator 1130c may be disposed corresponding to a third column line CL3, and may correspond to a third stage of the modulation unit 1100c.

The modulation unit 1100c may operate similarly to the modulation unit 1100a of FIG. 2. In comparison with the modulation unit 1100a of FIG. 2, the second modulator 1120c of the modulation unit 1100c may further generate a second residue voltage VR12 by performing delta-sigma modulation on the first residue voltage VR11, and the modulation unit 1100c may further include the third modulator 1130c that performs delta-sigma modulation on the second residue voltage VR12 to generate a third digital bit stream signal BS13.

Figure 8:
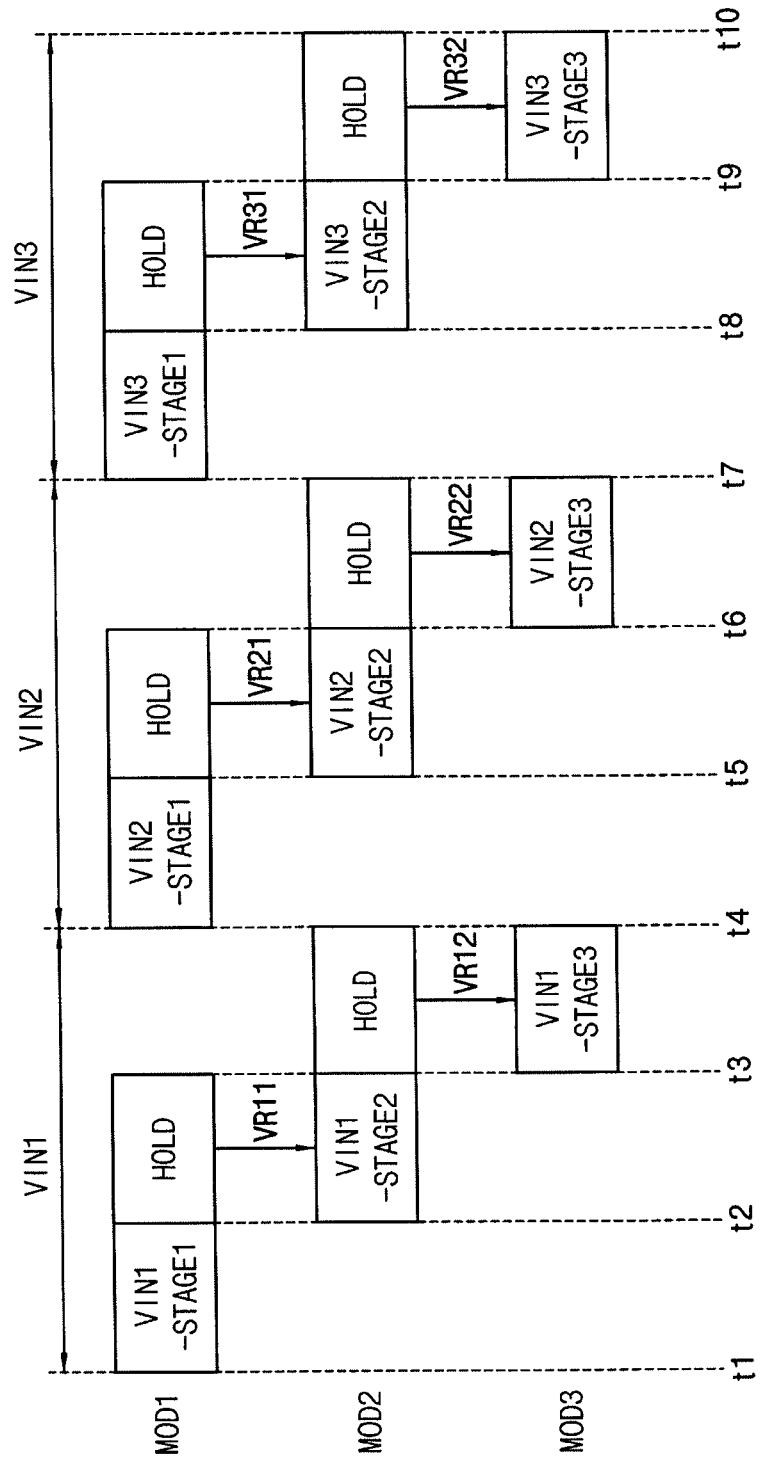
FIGS. 8 and 9 illustrate diagrams of an exemplary embodiment of an operation of the modulation unit of FIG. 7.
Figure 9:
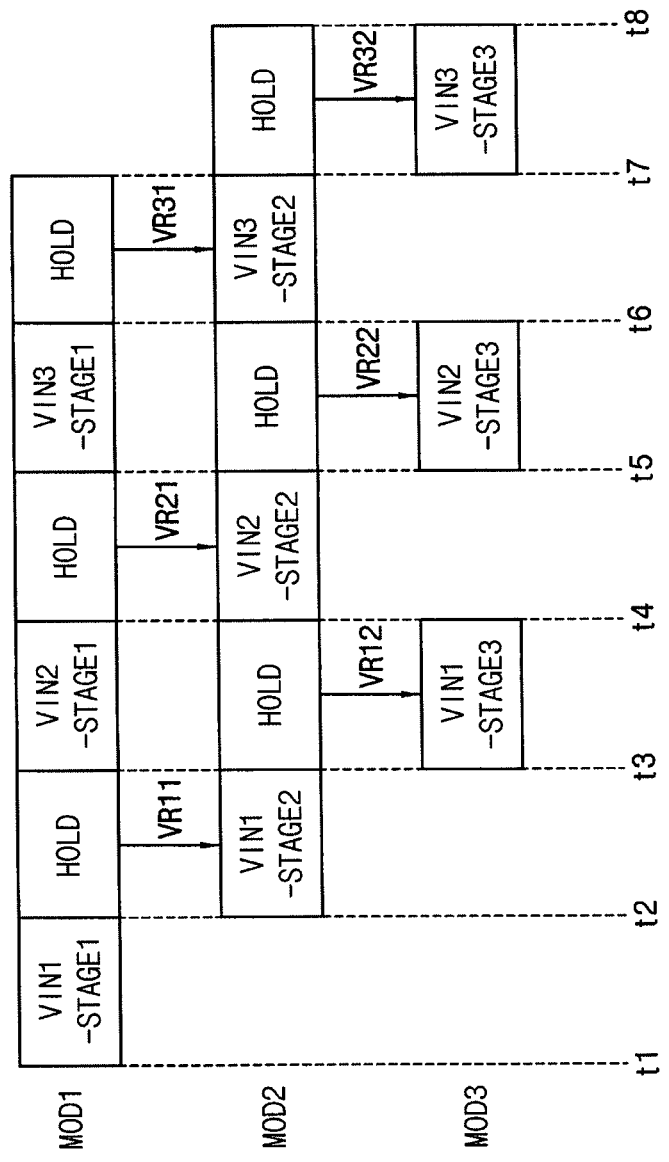

FIGS. 8 and 9 illustrate diagrams of an exemplary embodiment of an operation of the modulation unit of FIG. 7. In FIGS. 8 and 9, a reference numeral MOD1 indicates an operation of the first modulator 1110c, a reference numeral MOD2 indicates an operation of the second modulator 1120c, and a reference numeral MOD3 indicates an operation of the third modulator 1130c.

Hereinafter, an example of the operation of the modulation unit 1100c of FIG. 7 is described with reference to FIGS. 7 and 8.

In the exemplary embodiment illustrated in FIG. 8, the modulation unit 1100c may perform delta-sigma modulation on a first input signal VIN1 that is provided through the first column line CL1 during a first operation period (from time t1 to time t4), may perform delta-sigma modulation on a second input signal VIN2 that is provided through the second column line CL2 during a second operation period (from time t4 to time t7), and may perform delta-sigma modulation on a third input signal VIN3 that is provided through the third column line CL3 during a third operation period (from time t7 to time t10). That is, the modulation unit 1100c may perform delta-sigma modulation on the second input signal VIN2 after delta-sigma modulation on the first input signal VIN1 is completed, and may perform delta-sigma modulation on the third input signal VIN3 after delta-sigma modulation on the second input signal VIN2 is completed.

The operation of the modulation unit 1100c during a time period from time t1 to time t3 in FIG. 8 may be substantially the same as the operation of the modulation unit 1100b during the time period from time t1 to time t3 in FIG. 6. During a first modulation period (from time t1 to time t2) of the first operation period, the first modulator 1110c may generate the first residue voltage VR11 and a first digital bit stream signal BS11 based on the first input signal VIN1. During a second modulation period (from time t2 to time t3) of the first operation period, the second modulator 1120c may generate the second residue voltage VR12 and a second digital bit stream signal BS12 based on the first residue voltage VR11.

During a third modulation period (from time t3 to time t4) of the first operation period, the third modulator 1130c may perform delta-sigma modulation on the second residue voltage VR12 to generate the third digital bit stream signal BS13. While the third modulator 1130c performs delta-sigma modulation on the second residue voltage VR12, the second modulator 1120c may hold the second residue voltage VR12 to provide the second residue voltage VR12 to the third modulator 1130c.

Similarly, during the second operation period, the modulation unit 1100c may perform delta-sigma modulation on the second input signal VIN2 to sequentially generate a third residue voltage VR21 and a fourth digital bit stream signal BS21, a fourth residue voltage VR22 and a fifth digital bit stream signal BS22, and a sixth digital bit stream signal BS23. During the third operation period, the modulation unit 1100c may perform delta-sigma modulation on the third input signal VIN3 to sequentially generate a fifth residue voltage VR31 and a seventh digital bit stream signal BS31, a sixth residue voltage VR32 and a eighth digital bit stream signal BS32, and a ninth digital bit stream signal BS33.

In the analog-to-digital converter 1000 including the modulation unit 1100c of FIG. 7, the modulation unit 1100c may include the first, second, third modulators 1110c, 1120c, 1130c, which may each be implemented with a multi-stage, e.g., three-stage, structure, and thus the analog-to-digital converter 1000 may have enhanced operation speed.

Take, e.g., the analog-to-digital converter 1000 that includes the modulation unit 1100c operating as illustrated in FIG. 8, if the digital signal DS has twelve bits, the first digital bit stream signal BS11 corresponds to upper four bits of the first digital signal, the second digital bit stream signal BS12 corresponds to middle four bits of the first digital signal, and the third digital bit stream signal BS13 corresponds to lower four bits of the first digital signal. More particularly, e.g., in such an embodiment, it is required to spend $2^4+2^4+2^4$ (i.e. 48) clock periods for converting the first analog signal VIN1 into the first digital signal. Such a converting operation in the analog-to-digital converter 1000 that includes the modulation unit 1100c operating as illustrated in FIG. 8 may be sequentially performed with respect to the first input signal VIN1, the second input signal VIN2 and the third input signal VIN3. Thus, the analog-to-digital converter 1000 that includes the modulation unit 1100c operating as illustrated in FIG. 8 requires 144 clock periods to convert all analog signals input through the all column lines into digital signals.

Hereinafter, another example of the operation of the modulation unit 1100c of FIG. 7 is described with reference to FIGS. 7 and 9.

In another example embodiment illustrated in FIG. 9, the modulation unit 1100c may perform delta-sigma modulation on the first input signal VIN1 during a first operation period (from time t1 to time t4), may perform delta-sigma modulation on the second input signal VIN2 during a second operation period (from time t3 to time t6), and may perform delta-sigma modulation on the third input signal VIN3 during a third operation period (from time t5 to time t8). In FIG. 9, the first operation period and the second operation period are partially overlapped, and the second operation period and the third operation period are partially overlapped. That is, the modulation unit 1100c may perform delta-sigma modulation on the first, second and third input signals VIN1, VIN2 and VIN3 in the pipeline manner.

The operation of the modulation unit 1100c during a first modulation period (from time t1 to time t2) and a second modulation period (from time t2 to time t3) in FIG. 9 may be substantially the same as the operation of the modulation unit 1100c during the time period from time t1 to time t3 in FIG. 8.

During a third modulation period (from time t3 to time t4), the second modulator 1120c may hold the second residue voltage VR12, and the third modulator 1130c may perform delta-sigma modulation on the second residue voltage VR12 to generate the third digital bit stream signal BS13. Simultaneously, the first modulator 1110c may perform delta-sigma modulation on the second input signal VIN2 to generate the third residue voltage VR21 and the fourth digital bit stream signal BS21. The delta-sigma modulation on the first input signal VIN1 and the delta-sigma modulation on the second input signal VIN2 are partially overlapped in the third modulation period. The operation of the modulation unit 1100c during a fourth modulation period (from time t4 to time t5) in FIG. 9 may be substantially the same as the operation of the modulation unit 1100c during the time period from time t5 to time t6 in FIG. 8.

Similarly, during a fifth modulation period (from time t5 to time t6), delta-sigma modulation on the second input signal VIN2 and delta-sigma modulation on the third input signal VIN3 are partially overlapped. The second modulator 1120c may hold the fourth residue voltage VR22, the third modulator 1130c may perform delta-sigma modulation on the fourth residue voltage VR22 to generate the sixth digital bit stream signal BS23, and the first modulator 1110c may perform delta-sigma modulation on the third input signal VIN3 to generate the fifth residue voltage VR31 and the seventh digital bit stream signal BS31. Operation of the modulation unit 1100c during a sixth modulation period (from time t6 to time t7) and a seventh modulation period (from time t7 to time t8) in FIG. 9 may be substantially the same as the operation of the modulation unit 1100c during the time period from time t8 to time t10 in FIG. 8.

In the analog-to-digital converter 1000 including the modulation unit 1100c of FIG. 7, the modulation unit 1100c may include the first, second and third modulators 1110c, 1120c and 1130c that are implemented with, e.g., a three-stage structure, and the operations of delta-sigma modulation on input signals may be partially overlapped, thereby having enhanced operation speed.

In the analog-to-digital converter 1000 that includes the modulation unit 1100c operating as illustrated in FIG. 9, if the digital signal DS has twelve bits, and the digital bit stream signals BS11, BS12 and BS13 correspond to upper, middle and low four bits of the first digital signal, respectively, it is required to spend $2^4$ (i.e. 16) clock periods for each modulation period. Such a converting operation in the analog-to-digital converter 1000 that includes the modulation unit 1100c operating as illustrated in FIG. 9 may be performed with respect to the three input signals VIN1, VIN2 and VIN3 during seven modulation periods. Thus, the analog-to-digital converter 1000 that includes the modulation unit 1100c operating as illustrated in FIG. 9 utilizes 108 clock periods for converting all analog signals input through all the column lines into digital signals.

Figure 10:
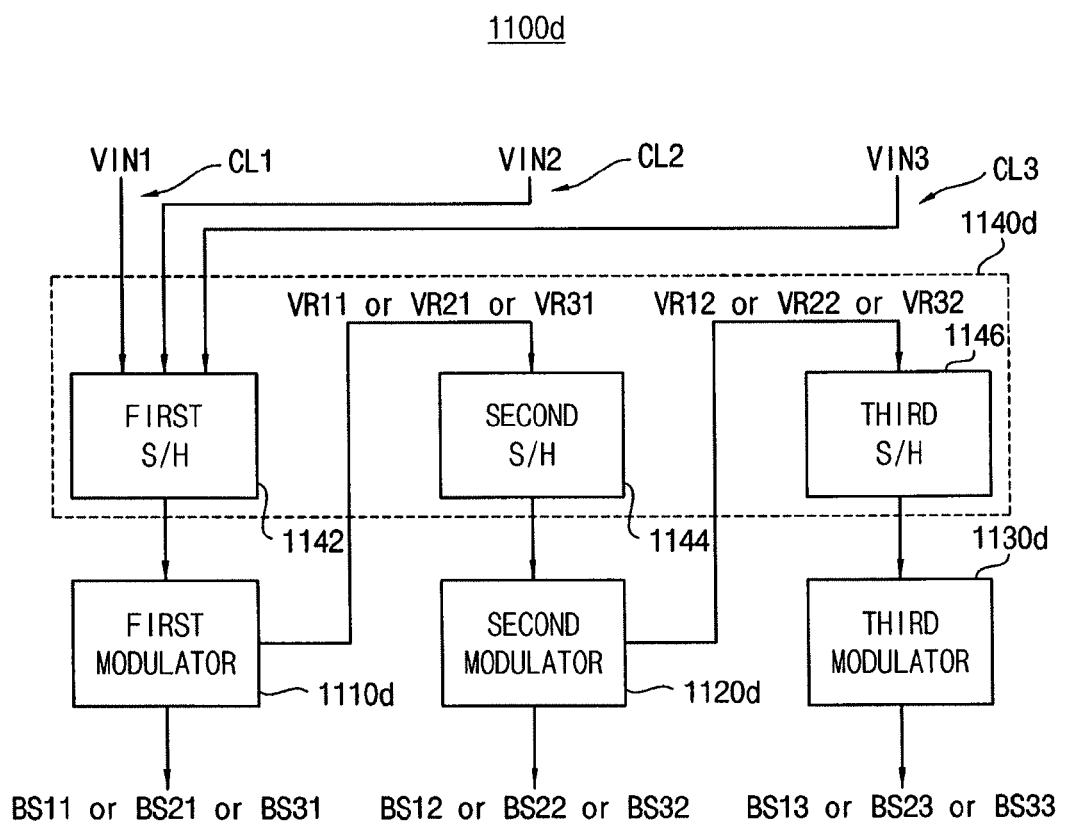
FIG. 10 illustrates a block diagram of another exemplary embodiment of a modulation unit employable in the analog-to-digital converter of FIG. 1.

FIG. 10 illustrates a block diagram of another exemplary embodiment of a modulation unit 1100d employable in the analog-to-digital converter of FIG. 1.

Referring to FIG. 10, the modulation unit 1100d may include a first modulator 1110d, a second modulator 1120d, a third modulator 1130d, and a sample-and-hold unit 1140d.

The modulation unit 1100d may be similar to the modulation unit 1100c of FIG. 7. In comparison with the modulation unit 1100c of FIG. 7, the modulation unit 1100d may further include the sample-and-hold unit 1140d that samples and holds input signals VIN1, VIN2 and VIN3 and residue voltages VR11, VR12, VR21, VR22, VR31 and VR32. The modulation unit 1100d may perform delta-sigma modulation on the input signals VIN1, VIN2 and VIN3 in the pipeline manner by using the sample-and-hold unit 1140d.

The sample-and-hold unit 1140d may include a first sample-and-hold block 1142, a second sample-and-hold block 1144 and a third sample-and-hold block 1146. The first sample-and-hold block 1142 may sample and hold each of the input signals VIN1, VIN2 and VIN3. The second sample-and-hold block 1144 may sample and hold each of the residue voltages VR11, VR21 and VR31 that is output from the first modulator 1110d. The third sample-and-hold block 1146 may sample and hold each of the residue voltages VR12, VR22 and VR32 that is output from the second modulator 1120d.

Figure 11:
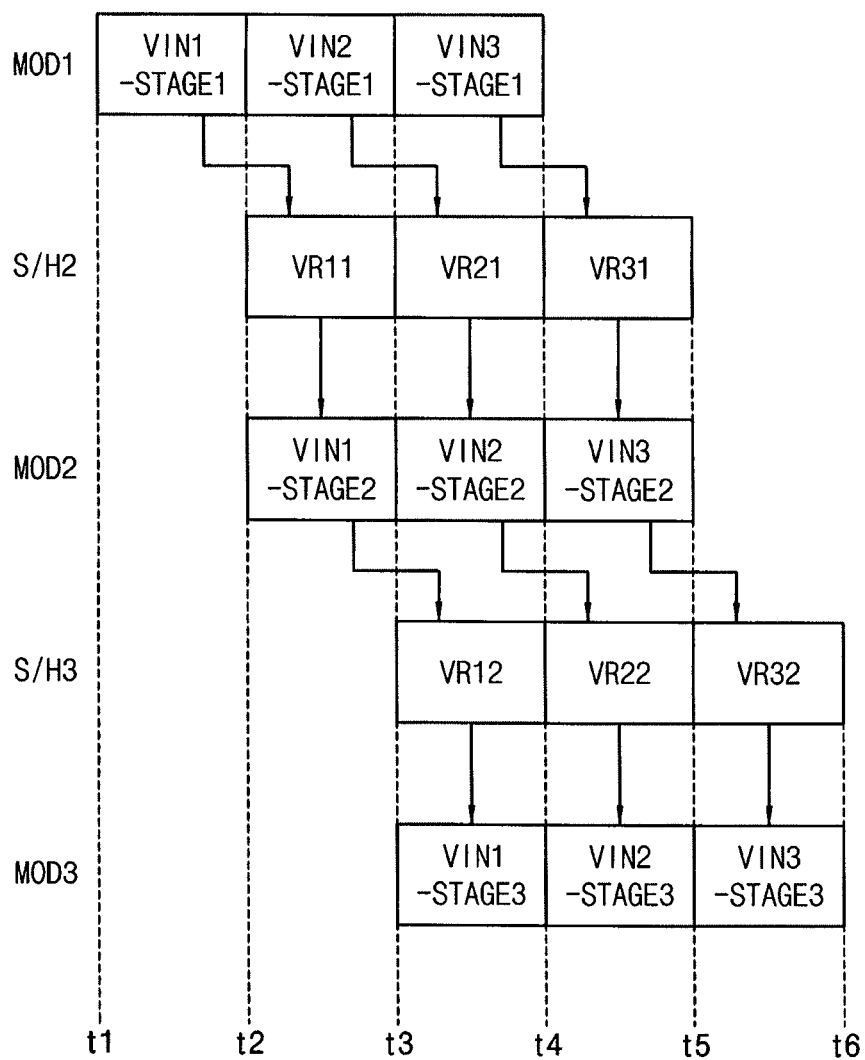
FIG. 11 illustrates a diagram of an exemplary embodiment of an operation of the modulation unit of FIG. 10.

FIG. 11 illustrates a diagram for describing an operation of the modulation unit of FIG. 10. In FIG. 11, a reference numeral MOD1 indicates an operation of the first modulator 1110d, a reference numeral MOD2 indicates an operation of the second modulator 1120d, a reference numeral MOD3 indicates an operation of the third modulator 1130d, a reference numeral S/H2 indicates an operation of the second sample-and-hold block 1144, and a reference numeral S/H3 indicates an operation of the third sample-and-hold block 1146.

Hereinafter, exemplary operation of the modulation unit 1100d of FIG. 10 will be described with reference to FIGS. 10 and 11.

During a first modulation period (from time t1 to time t2), the first modulator 1110d may perform delta-sigma modulation on a first input signal VIN1 to generate a first residue voltage VR11 and a first digital bit stream signal BS11.

During a second modulation period (from time t2 to time t3), the second sample-and-hold block 1144 may sample and hold the first residue voltage VR11 to provide the first residue voltage VR11 to the second modulator 1120d. The second modulator 1120d may perform delta-sigma modulation on the first residue voltage VR11 to generate a second residue voltage VR12 and a second digital bit stream signal BS12. Simultaneously, the first modulator 1110d may perform delta-sigma modulation on a second input signal VIN2 to generate a third residue voltage VR21 and a fourth digital bit stream signal BS21.

During a third modulation period (from time t3 to time t4), the third sample-and-hold block 1146 samples and holds the second residue voltage VR12 to provide the second residue voltage VR12 to the third modulator 1130d. The third modulator 1130d performs delta-sigma modulation on the second residue voltage VR12 to generate a third digital bit stream signal BS13. Simultaneously, the second sample-and-hold block 1144 may sample and hold the third residue voltage VR21 to provide the third residue voltage VR21 to the second modulator 1120d. The second modulator 1120d may perform delta-sigma modulation on the third residue voltage VR21 to generate a fourth residue voltage VR22 and a fifth digital bit stream signal BS22. In addition, the first modulator 1110d may perform delta-sigma modulation on a third input signal VIN3 to generate a fifth residue voltage VR31 and a seventh digital bit stream signal BS31.

During a fourth modulation period (from time t4 to time t5), the third sample-and-hold block 1146 may sample and hold the fourth residue voltage VR22 to provide the fourth residue voltage VR22 to the third modulator 1130d. The third modulator 1130d may perform delta-sigma modulation on the fourth residue voltage VR22 to generate a sixth digital bit stream signal BS23. Simultaneously, the second sample-and-hold block 1144 samples and holds the fifth residue voltage VR31 to provide the fifth residue voltage VR31 to the second modulator 1120d. The second modulator 1120d may perform delta-sigma modulation on the fifth residue voltage VR31 to generate a sixth residue voltage VR32 and an eighth digital bit stream signal BS32.

During a fifth modulation period (from time t5 to time t6), the third sample-and-hold block 1146 may sample and hold the sixth residue voltage VR32 to provide the sixth residue voltage VR32 to the third modulator 1130d. The third modulator 1130d may perform delta-sigma modulation on the sixth residue voltage VR32 to generate a ninth digital bit stream signal BS33.

In the analog-to-digital converter 1000 including the modulation unit 1100d of FIG. 10, the modulation unit 1100d may include the first, second, third modulators 1110d, 1120d, 1130d, which may be implemented with a multi-stage, e.g., three-stage, structure, and may include the sample-and-hold unit 1140d for the pipeline operation, thereby having enhanced operation speed. In the analog-to-digital converter 1000 including the modulation unit 1100d of FIG. 10, if the digital signal DS has twelve bits, and the digital bit stream signals BS11, BS12, BS13 correspond to upper, middle and lower four bits of the first digital signal, respectively, it is required to spend $2^4$ (i.e. 16) clock periods for each modulation period. Such a converting operation in the analog-to-digital converter 1000 including the modulation unit 1100d of FIG. 10 may be performed with respect to the three input signals VIN1, VIN2, VIN3 during five modulation periods. Thus, the analog-to-digital converter 1000 including the modulation unit 1100d of FIG. 10 requires 80 clock periods to convert all analog signals input through all the column lines into digital signals.

Figure 12:
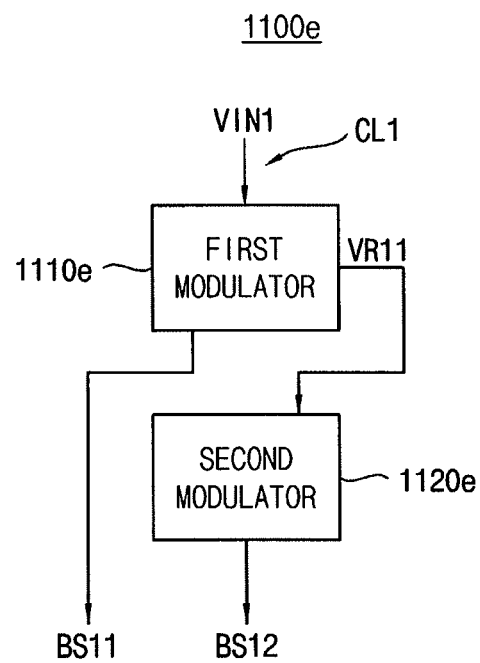
FIG. 12 illustrates a block diagram of another exemplary embodiment of a modulation unit employable in the analog-to-digital converter of FIG. 1.

FIG. 12 illustrates a block diagram of another exemplary embodiment of a modulation unit 1100e employable in the analog-to-digital converter of FIG. 1;

Referring to FIG. 12, the modulation unit 1100e may include a first modulator 1110e and a second modulator 1120e. The modulation unit 1100e may be disposed corresponding to one column line CL1, and may include two stages. The first and second modulators 1110e and 1120e may be disposed corresponding to a first column line CL1. The first modulator 1110e may correspond to a first stage of the modulation unit 1100e, and the second modulator 1120e may correspond to a second stage of the modulation unit 1100e.

Figure 13:
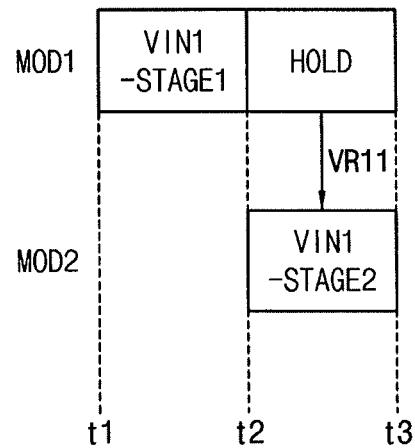
FIG. 13 illustrates a diagram of an exemplary embodiment of an operation of the modulation unit of FIG. 12.

FIG. 13 illustrates a diagram of an exemplary embodiment of an operation of the modulation unit 1100e of FIG. 12. In FIG. 13, a reference numeral MOD1 indicates an operation of the first modulator 1110e, and a reference numeral MOD2 indicates an operation of the second modulator 1120e.

Hereinafter, exemplary operation of the modulation unit 1100e of FIG. 12 is described with reference to FIGS. 12 and 13.

During a first modulation period (from time t1 to time t2), the first modulator 1110e may perform the delta-sigma modulation on a first input signal VIN1 to generate a first residue voltage VR11 and a first digital bit stream signal BS11. During a second modulation period (from time t2 to time t3), the first modulator 1110e may hold the first residue voltage VR11 to provide the first residue voltage VR11 to the second modulator 1120e, and the second modulator 1120e may perform the delta-sigma modulation on the first residue voltage VR11 to generate the second digital bit stream signal BS12. If the analog-to-digital converter 1000 is employed in an image sensor that includes a pixel array, the modulation unit 1100e may sequentially perform such delta-sigma modulation on each row of the pixel array.

Figure 14:
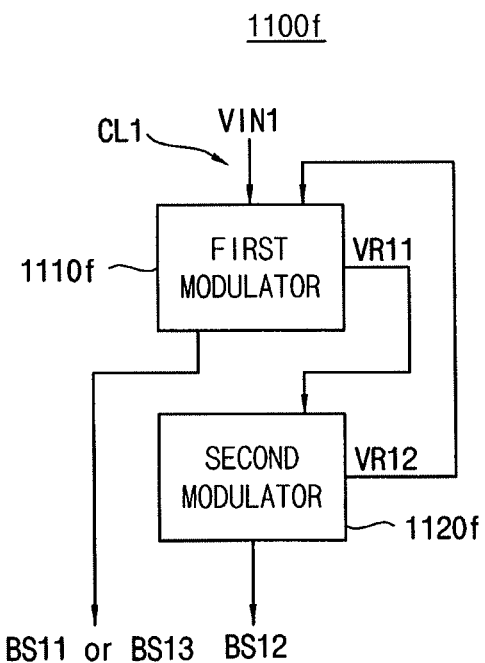
FIG. 14 illustrates a block diagram of another exemplary embodiment of a modulation unit employable in the analog-to-digital converter of FIG. 1.

FIG. 14 illustrates a block diagram of another exemplary embodiment of a modulation unit 1100f employable in the analog-to-digital converter of FIG. 1.

Referring to FIG. 14, the modulation unit 1100f may include a first modulator 1110f and a second modulator 1120f. The modulation unit 1100f may be disposed corresponding to one column line CL1, and may have three stages. The first and second modulators 1110f and 1120f may be disposed corresponding to a first column line CL1. The first modulator 1110f may correspond to a first stage and a third stage of the modulation unit 1100f, and the second modulator 1120f may correspond to a second stage of the modulation unit 1100f.

The modulation unit 1100f may be similar to the modulation unit 1100e of FIG. 12. In comparison with the modulation unit 1100e of FIG. 12, the second modulator 1120f of the modulation unit 1100f may further generate a second residue voltage VR12 by performing delta-sigma modulation on the first residue voltage VR11. The first modulator 1110f of the modulation unit 1100f may further perform delta-sigma modulation on the second residue voltage VR12 to generate a third digital bit stream signal BS13.

Figure 15:
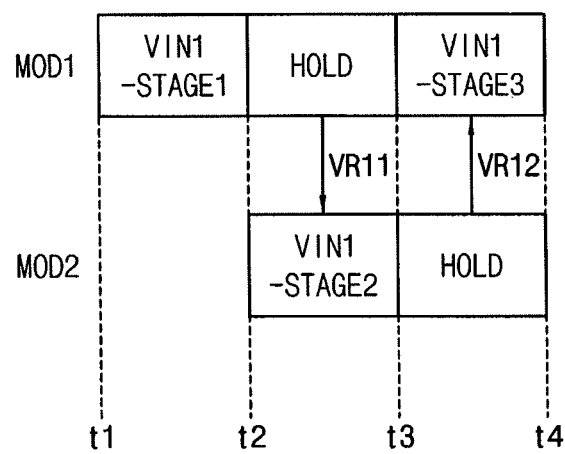
FIG. 15 illustrates a diagram of an exemplary embodiment of an operation of the modulation unit of FIG. 14.

FIG. 15 illustrates a diagram of an exemplary embodiment of an operation of the modulation unit 1100f of FIG. 14. In FIG. 15, a reference numeral MOD1 indicates an operation of the first modulator 1110f, and a reference numeral MOD2 indicates an operation of the second modulator 1120f.

Hereinafter, an exemplary operation of the modulation unit 1100f of FIG. 14 is described with reference to FIGS. 14 and 15.

The operation of the modulation unit 1100f during a time period from time t1 to time t3 in FIG. 15 may be similar to the operation of the modulation unit 1100e during the time period from time t1 to time t3 in FIG. 13. During the second modulation period (from time t2 to time t3), the second modulator 1120f further generates the second residue voltage VR12 by performing delta-sigma modulation on the first residue voltage VR11. During a third modulation period (from time t3 to time t4), the second modulator 1120f holds the second residue voltage VR12 to provide the second residue voltage VR12 to the first modulator 1110f, and the first modulator 1110f performs delta-sigma modulation on the second residue voltage VR12 to generate the third digital bit stream signal BS13.

Figure 16:
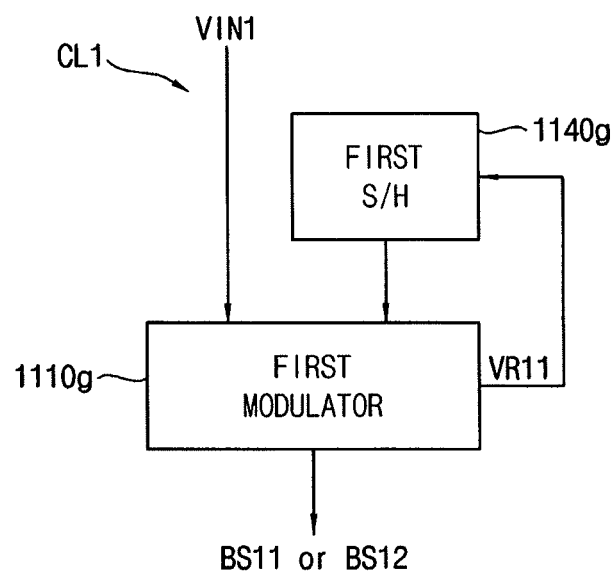
FIG. 16 illustrates a block diagram of another exemplary embodiment of the modulation unit employable in the analog-to-digital converter of FIG. 1.

FIG. 16 illustrates a block diagram of another exemplary embodiment of the modulation unit 1100g employable in the analog-to-digital converter of FIG. 1.

Referring to FIG. 16, the modulation unit 1100g may include a first modulator 1110g and a first sample-and-hold unit 1140g. The modulation unit 1100g may be disposed corresponding to one column line CL1, and may include two stages. The first modulator 1110g may be disposed corresponding to a first column line CL1, and may correspond to a first stage and a second stage of the modulation unit 1100g.

Figure 17:
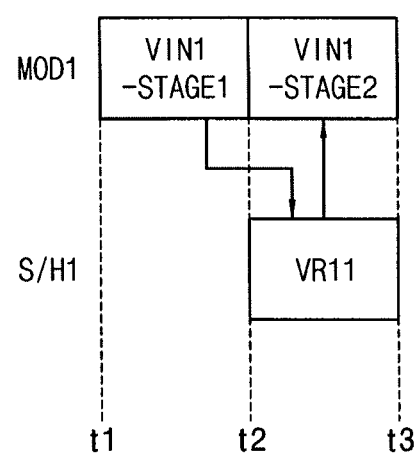
FIG. 17 illustrates a diagram of an exemplary embodiment of an operation of the modulation unit of FIG. 16.

FIG. 17 illustrates a diagram of an exemplary embodiment of an operation of the modulation unit 1100g of FIG. 16. In FIG. 17, a reference numeral MOD1 indicates an operation of the first modulator 1110g, and a reference numeral S/H1 indicates an operation of the first sample-and-hold unit 1140g.

Hereinafter, the operation of the modulation unit 1100g of FIG. 16 is described with reference to FIGS. 16 and 17.

The operation of the modulation unit 1100g during a first modulation period (from time t1 to time t2) in FIG. 17 may be substantially the same as the operation of the modulation unit 1100e during the time period from time t1 to time t2 in FIG. 13. During a second modulation period (from time t2 to time t3), the first sample-and-hold unit 1140g samples and holds the first residue voltage VR11 to provide the first residue voltage VR11 to the first modulator 1110g, and the first modulator 1110g performs delta-sigma modulation on the first residue voltage VR11 to generate the second digital bit stream signal BS12.

One or more embodiments of an analog-to-digital converter, e.g., the analog-to-digital converter 1000, may be disposed corresponding to one column line, and may include one of the modulation unit 1100e of FIG. 12, the modulation unit 1100f of FIG. 14, and the modulation unit 1100g of FIG. 16 including the multistage structure, thereby having enhanced operation speed.

Figure 18:
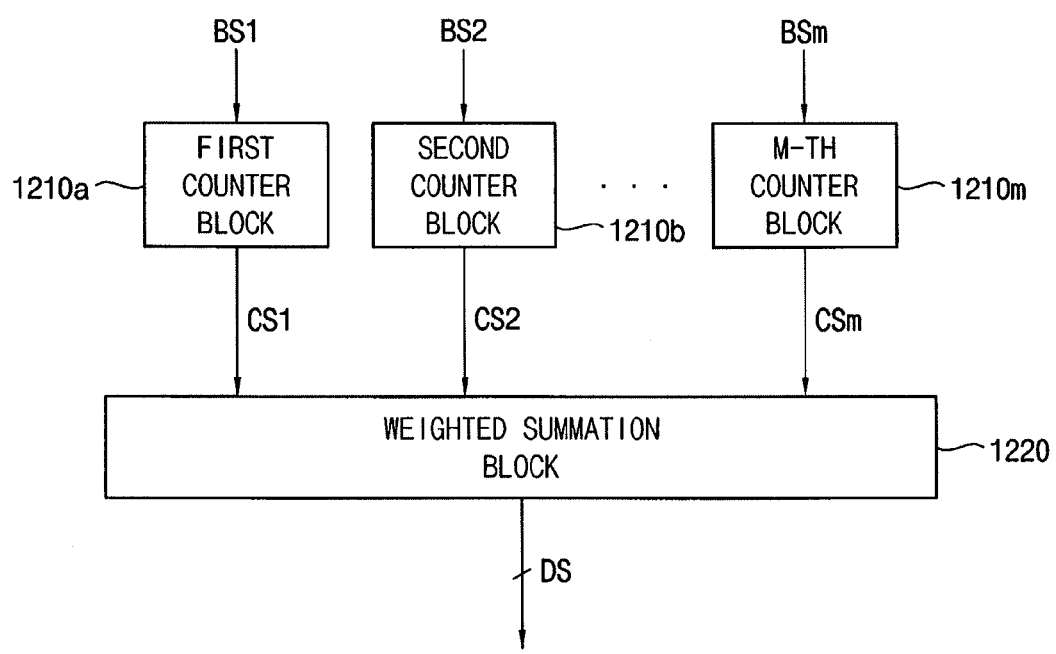
FIG. 18 illustrates a block diagram of an exemplary embodiment of a digital signal generation unit employable in the analog-to-digital converter of FIG. 1.

FIG. 18 illustrates a block diagram of exemplary embodiment of a digital signal generation unit 1200a employable in the analog-to-digital converter of FIG. 1.

Referring to FIG. 18, the digital signal generation unit 1200a may include a plurality of counter blocks 1210a, 1210b, ..., 1210m and a weighted summation block 1220.

Each of the plurality of counter blocks 1210a, 1210b, ..., 1210m may count a value of a respective one of digital bit stream signals BS1, BS2, ..., BSm to generate a respective one of count signals CS1, CS2, ..., CSm. Each of the digital bit stream signals BS1, BS2, ..., BSm may include at least one pulse, and each of the plurality of counter blocks 1210a, 1210b, ..., 1210m may count the number of pulses in the respective one of digital bit stream signals BS1, BS2, ..., BSm. For example, a first counter block 1210a may count a value of a first digital bit stream signal BS1 to generate a first count signal CS1, and may particularly count the number of pulses in the first digital bit stream signal BS1 to generate the first count signal CS1.

Each of the digital bit stream signals BS1, BS2, ..., BSm may be provided from a respective one stage of the modulation unit 1100 in FIG. 1. For example, the first digital bit stream signal BS1 may be provided from a first stage (e.g., a first modulator) of the modulation unit 1100.

In one or more embodiments, the number of the counter blocks included in the digital signal generation unit 1200a may correspond to the number of the modulators included in the modulation unit 1100 in FIG. 1. As illustrated in FIG. 2, if the modulation unit 1100a includes two modulators 1110a and 1120a, the digital signal generation unit 1200a may include two counter blocks. In another example embodiment, the number of the counter blocks included in the digital signal generation unit 1200a may correspond to the number of the stages included in the modulation unit 1100 in FIG. 1. As illustrated in FIG. 5, if the modulation unit 1100b includes two modulators 1110b and 1120b that are implemented with three-stage structure, the digital signal generation unit 1200a may include three counter blocks.

The weighted summation block 1220 may multiply each of the count signals CS1, CS2, ..., CSm by a respective weight value to generate weighted count signals, and may add the weighted count signals to each other to generate the digital signal DS. In one or more embodiments, if the first count signal CS1 corresponds to upper bits of the digital signal DS than a second count signal CS2, the weighted summation block 1220 may multiply the first count signal CS1 by a first weight value, and may multiply a second count signal CS2 by a second weight value that is smaller than the first weight value.

In one or more embodiments, the digital signal generation unit 1200a may further include a buffer unit (not illustrated) for storing the digital bit stream signals BS1, BS2, ..., BSm.

Figure 19:
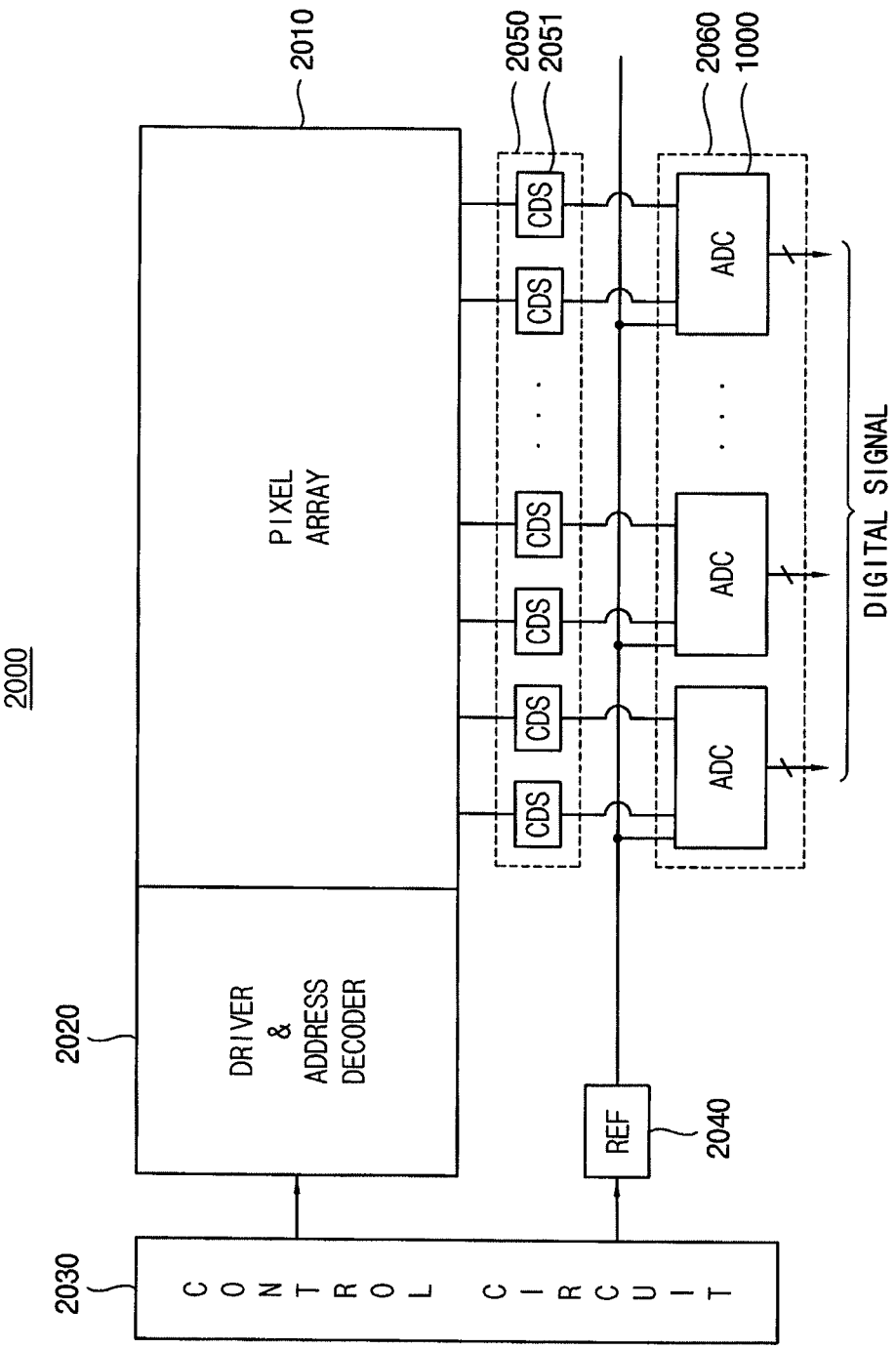
FIGS. 19 and 20 illustrate block diagrams of exemplary embodiments of image sensors including an embodiment of analog-to-digital converter according to one or more features described herein.
Figure 20:
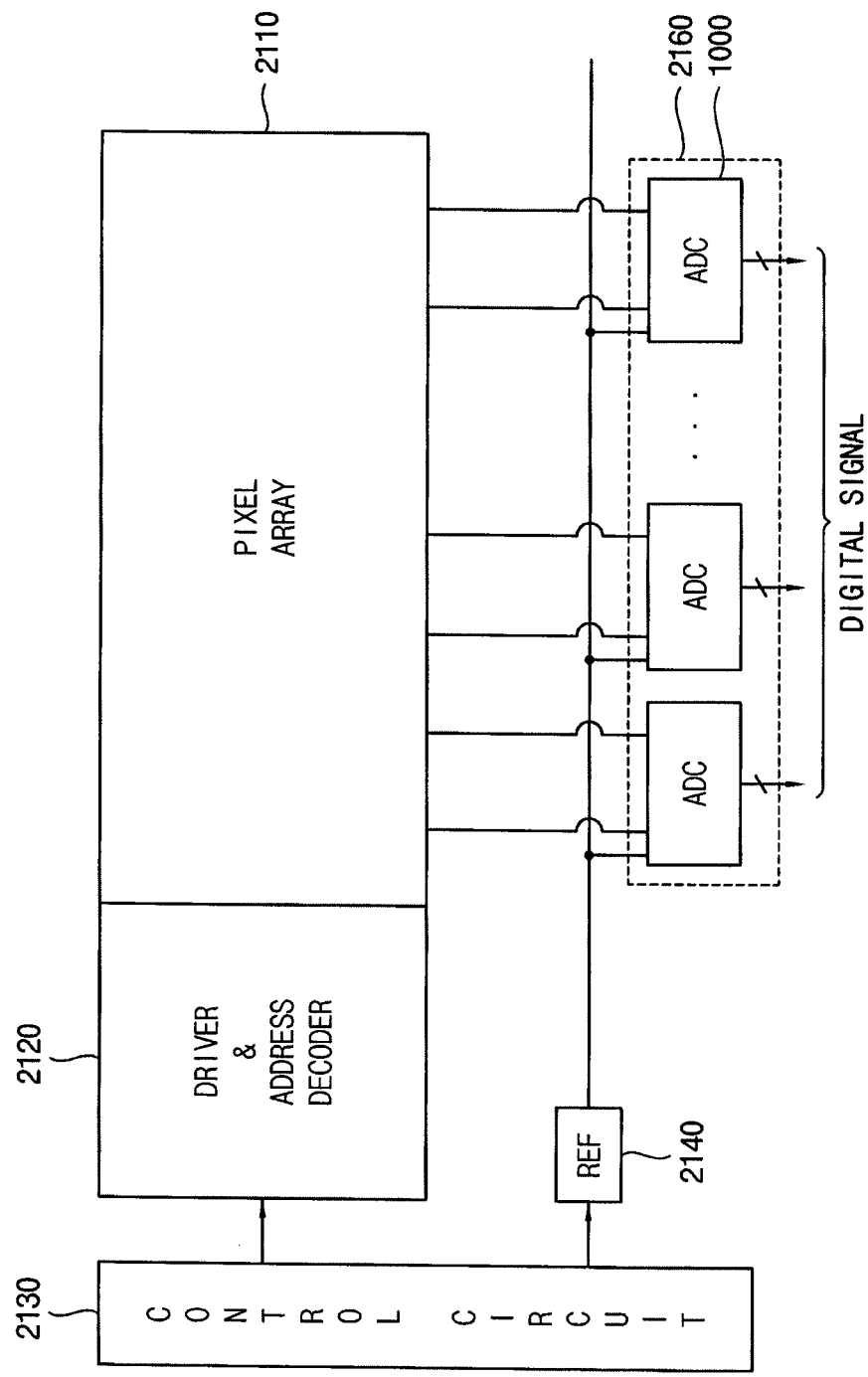

FIGS. 19 and 20 illustrate block diagrams of exemplary embodiments of image sensors 2000, 2100 including an embodiment of analog-to-digital converter according to one or more features described herein, e.g., 1000 of FIG. 1.

Referring to FIG. 19, the image sensor 2000 may include a pixel array 2010, a driver/address decoder 2020, a control circuit 2030, a reference signal generator 2040, a correlated double sampling (CDS) circuit 2050, and an analog-to-digital conversion circuit 2060.

To capture images, image sensors of a CCD type or a CMOS type are widely used for capturing an image by sensing incident lights. The image sensor 2000 of FIG. 19 may be a CCD image sensor or a CMOS image sensor.

In an example of the CMOS image sensor, the pixel array 2010 includes a plurality of unit pixels that are arranged in a matrix form. Each unit pixel converts an incident light into an electrical analog signal (e.g., analog pixel signal). In the image sensor including unit pixels referred to as active pixels or gain cells, respective signal from each unit pixel is detected by an address control of the unit pixels. The active pixel sensor may be an address-controlled image sensor, and the driver/address decoder 2020 may control operation of the pixel array 2010 by unit of a column and/or a row. The control circuit 2030 may generate control signals for controlling operations of the other components of the image sensor 2000.

The analog pixel signals detected by the pixel array 2010 are converted into digital signals by the analog-to-digital conversion circuit 2060. The analog pixel signals are output column by column, and are output through a plurality of column lines that are connected to columns of the pixel array 2010, respectively. Thus, the CDS circuit 2050 may include a plurality of CDS units 2051 according to the column number of the pixel array 2010. The analog-to-digital conversion circuit 2060 may include at least one analog-to-digital converter 1000 which may be disposed corresponding to at least one column line. Using the plurality of CDS units 2051 connected to each column line and at least one analog-to-digital converter 1000 connected to the at least one column line, the image sensor 2000 may simultaneously process a plurality of analog pixel signals corresponding to one row, thereby enhancing an operation speed and reducing noises.

The CDS circuit 2050 may perform an analog double sampling (ADS) by obtaining the difference between the reset component and the measured signal component using capacitors and switches, and may output analog signals corresponding to the effective signal components. The analog-to-digital conversion circuit 2060 may generate the digital signals based on the analog signals output column by column from the CDS circuit 2050 and a reference signal (e.g., a ramp signal) from the reference signal generator 2040.

The analog-to-digital converter 1000 may be the analog-to-digital converter 1000 of FIG. 1 that is implemented with a multistage structure. The analog-to-digital converter 1000 may include a modulation unit having at least one first-order incremental delta-sigma modulator, and a digital signal generation unit. The modulation unit may be disposed corresponding to the at least one column line, and may sequentially perform delta-sigma modulation on the analog pixel signals and at least one residue voltage by unit of a column to generate digital bit stream signals. The at least one residue voltage may be generated by performing delta-sigma modulation on the analog pixel signals and may correspond to quantization errors. The digital signal generation unit may generate the digital signals corresponding to the analog pixel signals based on the digital bit stream signals.

In one or more embodiments, when the analog-to-digital converter 1000 is disposed corresponding to two column lines as illustrated in FIG. 19, the modulation unit included in the analog-to-digital converter 1000 may be, e.g., the modulation unit 1100a of FIG. 2 or the modulation unit 1100b of FIG. 5. In one or more other embodiments, when the analog-to-digital converter 1000 is disposed corresponding to three column lines, the modulation unit included in the analog-to-digital converter 1000 may be the modulation unit 1100c of FIG. 7 or the modulation unit 1100d of FIG. 10. In one or more other embodiments, when the analog-to-digital converter 1000 is disposed corresponding to one column line, the modulation unit included in the analog-to-digital converter 1000 may be the modulation unit 1100e of FIG. 12, the modulation unit 1100f of FIG. 14 or the modulation unit 1100g of FIG. 16.

The analog-to-digital converter 1000 may be adopted in the image sensor 2000 performing ADS as described referring to FIG. 19. Also the analog-to-digital converter 1000 may be adopted in the image sensors performing a digital double sampling (DDS) as will be described referring to FIG. 20. The DDS is one of the CDS where the analog signals corresponding to the reset component and the measured signal component are converted into the digital signals, respectively, and the effective signal component is abstracted by obtaining the difference between the two digital signals.

Referring to FIG. 20, the image sensor 2100 may include a pixel array 2110, a driver/address decoder 2120, a control circuit 2130, a reference signal generator 2140 and an analog-to-digital conversion circuit 2160. The image sensor 2100 of FIG. 20 has a configuration for performing DDS whereas the image sensor 2000 of FIG. 19 has a configuration for performing ADS.

The pixel array 2110 may include a plurality of pixels for converting incident lights into electrical analog signals. The driver/address decoder 2120 may control operation of the pixel array 2110 by unit of a column and/or a row. The control circuit 2130 may generate control signals for controlling operations of the other components of the image sensor 2100.

The analog pixel signals detected by the pixel array 2110 may be converted into digital signals by the analog-to-digital conversion circuit 2160. The analog pixel signals may be output column by column, and may be output through a plurality of column lines that are connected to columns of the pixel array 2110, respectively. Thus, the analog-to-digital conversion circuit 2160 may include at least one analog-to-digital converter 1000 that is disposed corresponding to at least one column line.

The pixel array 2110 may sequentially output a first analog signal and a second analog signal for CDS, where the first analog signal indicates a reset component and the second analog signal indicates a measured image component. The analog-to-digital conversion circuit 2160 may perform DDS based on the first and second analog signals.

The analog-to-digital converter 1000 may be the analog-to-digital converter 1000 of FIG. 1 that is implemented with a multistage structure. The analog-to-digital converter 1000 may include a modulation unit having at least one first-order incremental delta-sigma modulator, and a digital signal generation unit.

As described above, the analog-to-digital converter according to one or more embodiments may have relatively small size, low power consumption, and enhanced operation speed. Thus, an image sensor including an analog-to-digital converter according to one or more embodiments may reduce power consumption and signal conversion time although a frame rate, a resolution, and a number of unit pixels in the image sensor may be increased.

Figure 21:
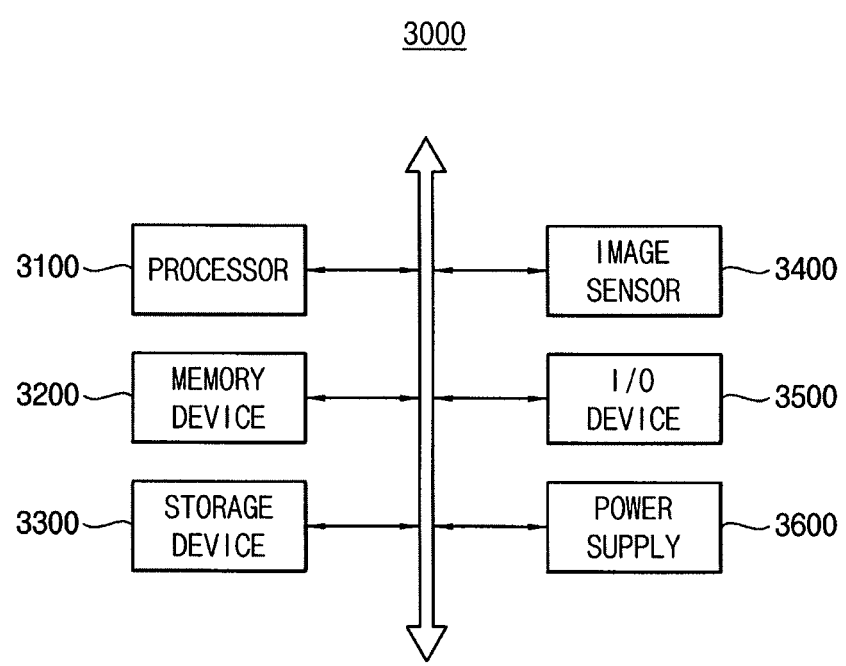
FIG. 21 illustrates a block diagram illustrating an example of an electronic system including the image sensor of FIG. 19 or the image sensor of FIG. 20.

FIG. 21 illustrates a block diagram illustrating an example of an electronic system including the image sensor of FIG. 19 or the image sensor of FIG. 20.

Referring to FIG. 21, the electronic system 3000 may include a processor 3100, a memory device 3200, a storage device 3300, an input/output (I/O) device 3500, a power supply 3600 and an image sensor 340. Although not illustrated in FIG. 21, the electronic system 3000 may further include a plurality of ports for communicating a video card, a sound card, a memory card, a universal serial bus (USB) device, other electric devices, etc.

The processor 3100 may perform various computing functions. The processor 3100 may be a micro processor, a central processing unit (CPU), and etc. The processor 3100 may be connected to the memory device 3200, the storage device 3300, and the I/O device 3500 via a bus such as an address bus, a control bus, a data bus, etc. The processor 3100 may be connected to an extended bus such as a peripheral component interconnection (PCI) bus.

The memory device 3200 may store data for operations of the electronic system 3000. For example, the memory device 3200 may include a dynamic random access memory (DRAM) device, a static random access memory (SRAM) device, an erasable programmable read-only memory (EPROM) device, an electrically erasable programming read-only memory (EEPROM) device, a flash memory device, etc.

The storage device 3300 may include a solid state drive device, a hard disk drive device, a CD-ROM device, etc. The I/O device 3500 may include input devices such as a keyboard, a keypad, a mouse, etc, and output devices such as a printer, a display device, etc. The power supply 3600 may provide a power for operations of the electronic system 3000.

The image sensor 3400 may communicate with the processor 3100 via the bus or other communication links. The image sensor 3400 may be the image sensor 2000 of FIG. 19 or the image sensor 2100 of FIG. 20. The image sensor 3400 may include the analog-to-digital converter 1000 of FIG. 1 that is disposed corresponding to at least one column line and is implemented with a multistage structure.

In one or more embodiments, the image sensor 3400 and the processor 3100 may be fabricated as one integrated circuit chip. In other embodiments, the image sensor 3400 and the processor 3100 may be fabricated as two separate integrated circuit chips.

The above described embodiments may be applied to an image sensor, and an electronic system having the image sensor. For example, the electronic system may be a system using an image sensor such as a computer, a digital camera, a 3-D camera, a cellular phone, a personal digital assistant (PDA), a scanner, a navigation system, a video phone, a surveillance system, an auto-focusing system, a tracking system, a motion-sensing system, an image-stabilization system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An analog-to-digital converter, comprising:
 a modulation unit disposed corresponding to at least one column line, the modulation unit configured to sequentially perform delta-sigma modulation on an analog input signal and at least one residue voltage to generate digital bit stream signals, the analog input signal being input through the at least one column line, the at least one residue voltage being generated by performing the delta-sigma modulation on the analog input signal, the modulation unit including
  a first modulator disposed corresponding to a first column line, the first modulator configured to perform delta-sigma modulation on a first input signal of the analog input signal to generate a first residue voltage and a first digital bit stream signal, the first input signal being input through the first column line; and
  a second modulator configured to perform delta-sigma modulation on the first residue voltage to generate a second digital bit stream signal; and
 a digital signal generation unit configured to generate a digital signal corresponding to the analog input signal based on the digital bit stream signals.

2. The analog-to-digital converter as claimed in claim 1, wherein the second modulator is disposed corresponding to a second column line.

3. The analog-to-digital converter as claimed in claim 2, wherein the first column line and the second column line are adjacent to each other, and
 wherein the first modulator further performs delta-sigma modulation on a second input signal of the analog input signal to generate a second residue voltage and a third digital bit stream signal, and the second modulator further performs delta-sigma modulation on the second residue voltage to generate a fourth digital bit stream signal, the second input signal being input through the second column line.

4. The analog-to-digital converter of as claimed in claim 3, wherein the first digital bit stream signal corresponds to upper bits of a first digital signal of the digital signal, the second digital bit stream signal corresponds to lower bits of the first digital signal, the third digital bit stream signal corresponds to upper bits of a second digital signal of the digital signal, and the fourth digital bit stream signal corresponds to lower bits of the second digital signal, the first digital signal being generated based on the first input signal, the second digital signal being generated based on the second input signal.

5. The analog-to-digital converter of as claimed in claim 3, wherein the third digital bit stream signal and the fourth digital bit stream signal are generated after the first digital bit stream signal and the second digital bit stream signal are generated.

6. The analog-to-digital converter of as claimed in claim 3, further comprising:
 a sample-and-hold unit configured to sample and hold the first residue voltage and the second residue voltage.

7. The analog-to-digital converter of as claimed in claim 6, wherein the sample-and-hold unit provides the first residue voltage to the second modulator while the second modulator performs delta-sigma modulation on the first residue voltage, and the first modulator performs delta-sigma modulation on the second input signal to generate the second residue voltage and the third digital bit stream signal while the second modulator performs delta-sigma modulation on the first residue voltage.

8. The analog-to-digital converter of as claimed in claim 2, wherein the first modulator holds the first residue voltage to provide the first residue voltage to the second modulator while the second modulator performs delta-sigma modulation on the first residue voltage.

9. The analog-to-digital converter as claimed in claim 2, wherein the second modulator further generates a second residue voltage by performing delta-sigma modulation on the first residue voltage, and the first modulator further performs delta-sigma modulation on the second residue voltage to generate a third digital bit stream signal.

10. The analog-to-digital converter as claimed in claim 1, wherein the modulation unit includes:
 a third modulator disposed corresponding to a third column line, the third modulator configured to perform delta-sigma modulation on the second residue voltage to generate a third digital bit stream signal, the second modulator being disposed corresponding to a second column line.

11. The analog-to-digital converter as claimed in claim 10, wherein the first modulator holds the first residue voltage to provide the first residue voltage to the second modulator while the second modulator performs the delta-sigma modulation on the first residue voltage, and the second modulator holds the second residue voltage to provide the second residue voltage to the third modulator while the third modulator performs the delta-sigma modulation on the second residue voltage.

12. The analog-to-digital converter as claimed in claim 11, wherein the first modulator performs the delta-sigma modulation on a second input signal of the analog input signal to generate a third residue voltage and a fourth digital bit stream signal while the third modulator performs the delta-sigma modulation on the second residue voltage, the second input signal being input through the second column line.

13. The analog-to-digital converter as claimed in claim 1, wherein the second modulator is disposed corresponding to the first column line.

14. An analog-to-digital converter comprising:
a modulation unit disposed corresponding to at least one column line, the modulation unit configured to sequentially perform delta-sigma modulation on an analog input signal and at least one residue voltage to generate digital bit stream signals, the analog input signal being input through the at least one column line, the at least one residue voltage being generated by performing the delta-sigma modulation on the analog input signal, wherein the modulation unit includes:
  a modulator disposed corresponding to a first column line, the modulator configured to perform delta-sigma modulation on a first input signal of the analog input signal to generate a first residue voltage and a first digital bit stream signal, and configured to perform delta-sigma modulation on the first residue voltage to generate a second digital bit stream signal, the first input signal being input through the first column line, and
  a sample-and-hold unit configured to sample and hold the first residue voltage; and
a digital signal generation unit configured to generate a digital signal corresponding to the analog input signal based on the digital bit stream signals.

15. An image sensor, comprising:
a pixel array including a plurality of unit pixels, each unit pixel configured to convert an incident light into an analog pixel signal; and
an analog-to-digital conversion circuit including at least one analog-to-digital converter converting the analog pixel signal into a digital signal, the analog-to-digital converter comprising:
a modulation unit disposed corresponding to at least one column line of the pixel array, the modulation unit configured to sequentially perform delta-sigma modulation on the analog pixel signal and at least one residue voltage to generate digital bit stream signals, the analog pixel signal being output from the pixel array through the at least one column line, the at least one residue voltage being generated by performing delta-sigma modulation on the analog pixel signal, the modulation unit including
  a first modulator disposed corresponding to a first column line, the first modulator configured to perform delta-sigma modulation on a first input signal of the analog input signal to generate a first residue voltage and a first digital bit stream signal, the first input signal being input through the first column line; and
  a second modulator configured to perform delta-sigma modulation on the first residue voltage to generate a second digital bit stream signal; and
a digital signal generation unit configured to generate the digital signal based on the digital bit stream signals.

* * * * *